(12) United States Patent
Cooke et al.

(10) Patent No.: US 9,917,217 B2
(45) Date of Patent: Mar. 13, 2018

(54) SOLAR ANTENNA ARRAY AND ITS FABRICATION AND USES

(71) Applicants: Laurence H. Cooke, Los Gatos, CA (US); William J. Allen, Cupertino, CA (US)

(72) Inventors: Laurence H. Cooke, Los Gatos, CA (US); William J. Allen, Cupertino, CA (US)

(73) Assignee: NOVASOLIX, INC., San Jose, CA (US)

( * ) Notice: Subject to any disclaimer, the term of this patent is extended or adjusted under 35 U.S.C. 154(b) by 45 days.

(21) Appl. No.: 14/701,765

(22) Filed: May 1, 2015

(65) Prior Publication Data

US 2015/0243817 A1  Aug. 27, 2015

Related U.S. Application Data

(63) Continuation-in-part of application No. 14/582,747, filed on Dec. 24, 2014, which is a
(Continued)

(51) Int. Cl.
| | |
|---|---|
| *H01Q 21/08* | (2006.01) |
| *H01L 31/042* | (2014.01) |
| *H02N 6/00* | (2006.01) |
| *H01L 31/0352* | (2006.01) |
| *H01L 31/108* | (2006.01) |

(Continued)

(52) U.S. Cl.
CPC .. *H01L 31/035209* (2013.01); *H01L 31/0475* (2014.12); *H01L 31/108* (2013.01); *H01Q 1/248* (2013.01); *H02S 40/22* (2014.12); *Y02E 10/52* (2013.01)

(58) Field of Classification Search
CPC ........... H01L 31/035209; H01L 31/108; H01L 31/0475; H01Q 1/248; H02S 40/22
USPC .................. 136/244; 313/358; 343/843, 850; 977/950
See application file for complete search history.

(56) References Cited

U.S. PATENT DOCUMENTS

| | | |
|---|---|---|
| 5,043,739 A | 8/1991 | Logan et al. |
| 7,354,877 B2 | 4/2008 | Rosenberger et al. |

(Continued)

FOREIGN PATENT DOCUMENTS

| | | | |
|---|---|---|---|
| WO | 2014063149 A1 | 4/2014 | |
| WO | WO 2014063149 A1 * | 4/2014 | ......... H01L 51/0048 |

OTHER PUBLICATIONS

Office Action dated Nov. 14, 2016 in U.S. Appl. No. 14/582,747, by Cooke.

(Continued)

*Primary Examiner* — Angelo Trivisonno
(74) *Attorney, Agent, or Firm* — Panitch Schwarze Belisario & Nadel LLP

(57) ABSTRACT

A solar antenna array may comprise an array of randomly placed carbon nanotube antennas that may capture and convert sunlight into electrical power. Methods for constructing the solar antenna array may use a mold and self aligning processing steps to minimize cost. Designs may be optimized for capturing a broad spectrum of non-polarized light. Alternatively, the array may generate light, and when connected in to an array of independently controllable sections may operate as either a reflective or light transmitting display.

9 Claims, 25 Drawing Sheets

Related U.S. Application Data continuation-in-part of application No. 13/454,155, filed on Apr. 24, 2012.

(51) Int. Cl.
*H02S 40/22* (2014.01)
*H01L 31/0475* (2014.01)
*H01Q 1/24* (2006.01)

(56) References Cited

U.S. PATENT DOCUMENTS

| | | | |
|---|---|---|---|
| 7,354,977 | B1 | 4/2008 | Woods et al. |
| 7,431,965 | B2 | 10/2008 | Grigorian et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 7,687,160 | B2 | 3/2010 | Winarski |
| 7,744,793 | B2 | 6/2010 | Lemaire et al. |
| 8,137,653 | B1 | 3/2012 | Predtechensky et al. |
| 2004/0085247 | A1 | 5/2004 | Mickle et al. |
| 2005/0112049 | A1 | 5/2005 | Hofmeister |
| 2005/0214198 | A1 | 9/2005 | Park et al. |
| 2007/0240757 | A1* | 10/2007 | Ren ............... B82Y 20/00 136/256 |
| 2009/0128893 | A1 | 5/2009 | McCarthy et al. |
| 2010/0084475 | A1* | 4/2010 | Hata ............... G06K 19/0701 235/492 |
| 2010/0244656 | A1* | 9/2010 | Ito ............... H01Q 1/2283 313/358 |
| 2010/0263709 | A1 | 10/2010 | Norman et al. |
| 2010/0284086 | A1 | 11/2010 | Novack et al. |
| 2011/0121258 | A1* | 5/2011 | Hanein ............... B82Y 10/00 257/9 |
| 2012/0206085 | A1 | 8/2012 | Stevens |
| 2012/0211063 | A1 | 8/2012 | Lee et al. |
| 2013/0249771 | A1 | 9/2013 | Kotter et al. |
| 2013/0276861 | A1 | 10/2013 | Cooke |
| 2015/0130692 | A1 | 5/2015 | Cooke |
| 2015/0155396 | A1 | 6/2015 | Cooke et al. |
| 2016/0027949 | A1 | 1/2016 | Cooke et al. |

OTHER PUBLICATIONS

Office Action dated Dec. 29, 2016 in U.S. Appl. No. 15/133,807, by Cooke et al.

Collinear - Definition and More from the Free Merriam-Webster Dictionary, "http://www.merriam-webstercomi lictionary/col-linear", 2014.

Rows—Definition and More from the Free Merriam-Webster Dictionary, "http://www.merriam-webster.com/dictionary/rows," 2014.

Siciliano et al., "Nano-Rectenna for High Efficiency Direct Conversion of Sunlight to Electricity," presented at 17th World Micromachine Summit, Apr. 26-29, 2011.

M. Williams, "Rice's carbon nanotube fibers outperform copper," at "http://news.rice.edu/2014/02/13/rices-carbon-nanotube-fibers-outperform-copper-2," posted Feb. 13, 2014.

K. Hata, "From Super Growth to DWNT forests, CNT solids, Flexible Transparent CNT films, and Super-Capacitors and Much More," Jun. 19, 2006.

Y. Ma et al., "The production of horizontally aligned single-walled carbon nanotubes," Carbon, 49, pp. 4098-4110, 2011.

M. Kumar, "Chemical Vapor Deposition of Carbon Nanotubes: A Review on Growth Mechanism and Mass Production," Journal of Nanoscience and Nanotechnology, vol. 10, pp. 3739-3758, 2010.

Office Action dated Feb. 11, 2014 in U.S. Appl. No. 13/454,155.
Office Action dated Jun. 27, 2014 in U.S. Appl. No. 13/454,155.
Office Action dated Sep. 26, 2014 in U.S. Appl. No. 13/454,155.
Office Action dated Jan. 13, 2015 in U.S. Appl. No. 13/454,155.

type—definition of type by The Free Dictionary, downloaded from web page: http://www.thefreedictionary.com/type, Download date: Mar. 9, 2015, original posting date: unknown, 1 page.

Office Action dated Mar. 17, 2015 in U.S. Appl. No. 13/454,155.
Int'l Search Report and Written Opinion dated Apr. 8, 2016 in Int'l Application No. PCT/US15/59852.
Int'l Search Report and Written Opinion dated Aug. 11, 2016 in Int'l Application No. PCT/US16/29336.
Office Action dated Apr. 5, 2017 in U.S. Appl. No. 14/582,747 by Cooke.
Int'l Preliminary Report dated Jul. 6, 2017 in PCT Application No. PCT/US2015/059852.
Office Action dated May 4, 2017 in U.S. Appl. No. 15/249,953, by Cooke.
Office Action dated Apr. 20, 2017 in U.S. Appl. No. 14/871,958, by Cooke.
Int'l Search Report and Written Opinion dated Jun. 20, 2017 in Int'l Application No. PCT/US2017/026130.
Office Action dated Jul. 3, 2017 in U.S. Appl. No. 15/133,807, by Cooke.
Office Action dated Jul. 27, 2017 in U.S. Appl. No. 15/411,396, by Cooke.
Office Action dated Sep. 22, 2017 in U.S. Appl. No. 13/454,155, by Cooke.

* cited by examiner

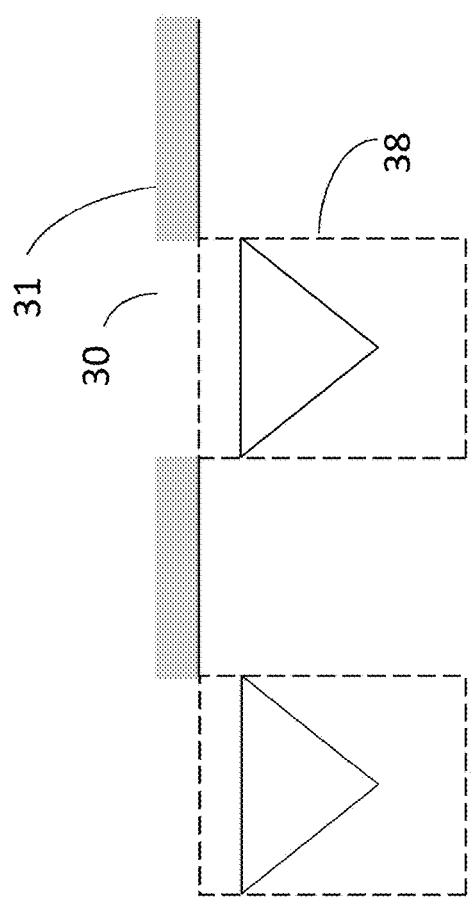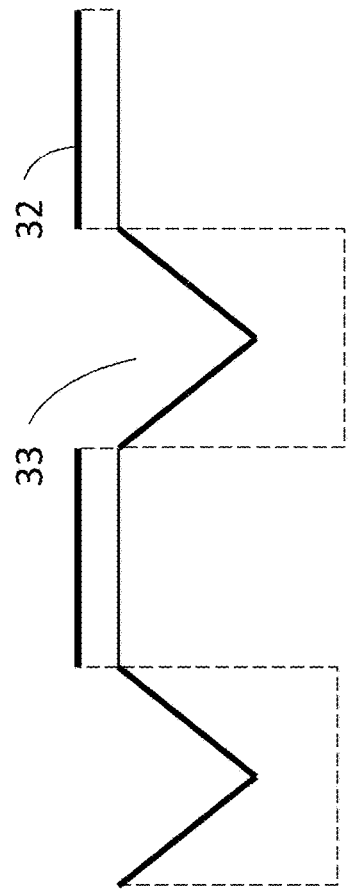
Figure 3a
Figure 3b

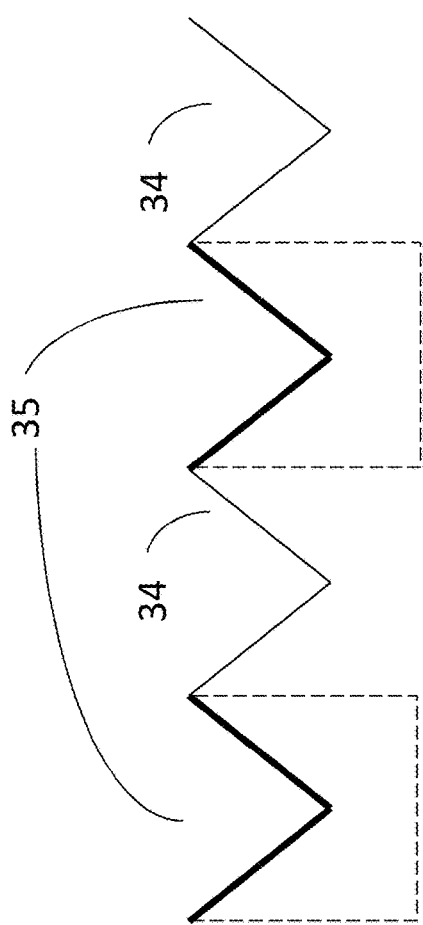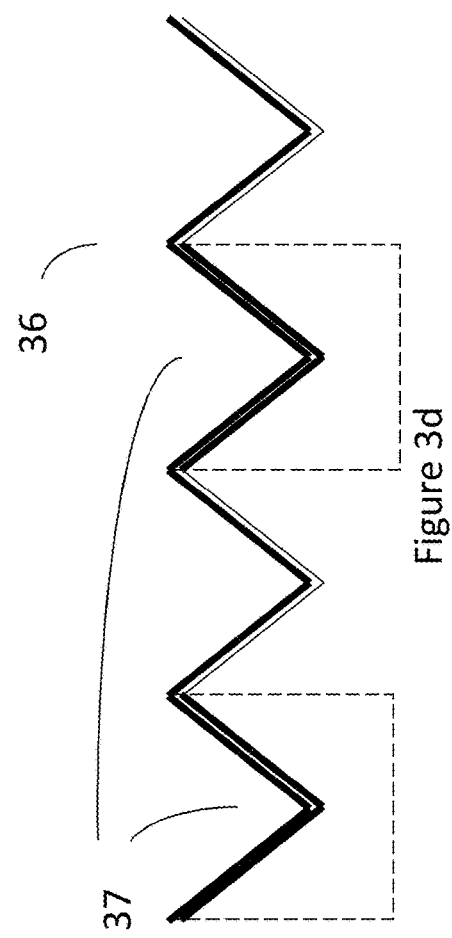

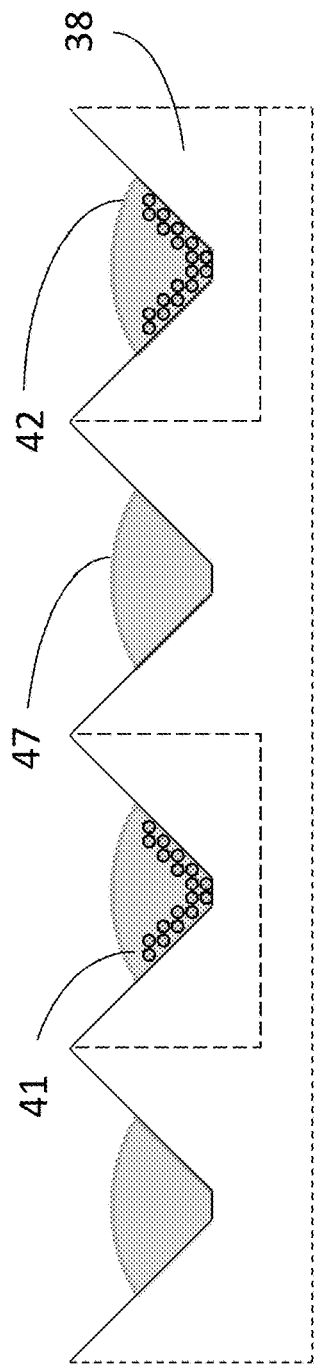
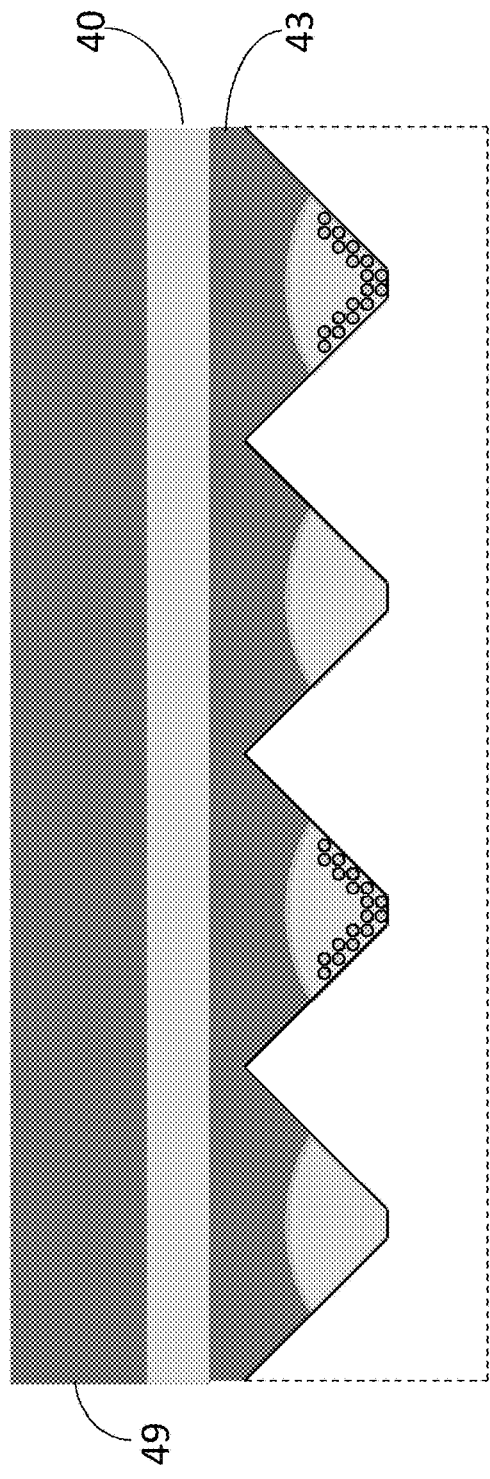
Figure 4a
Figure 4b

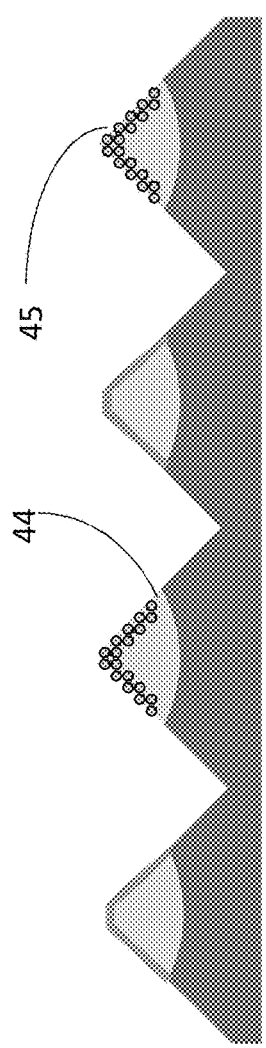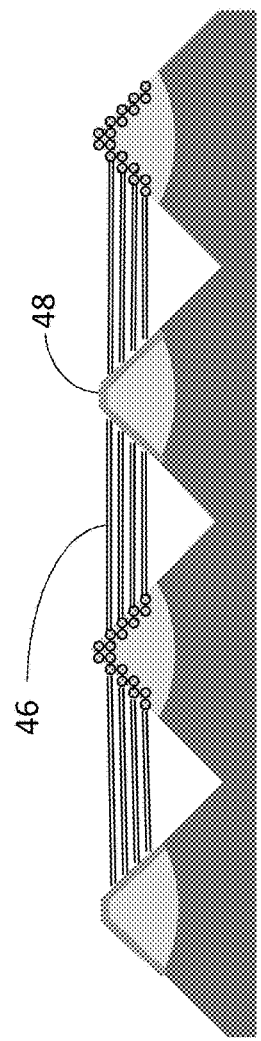

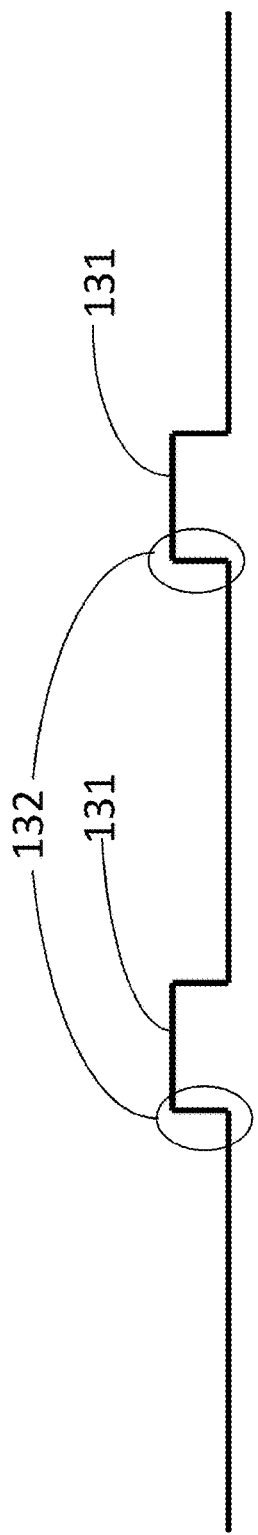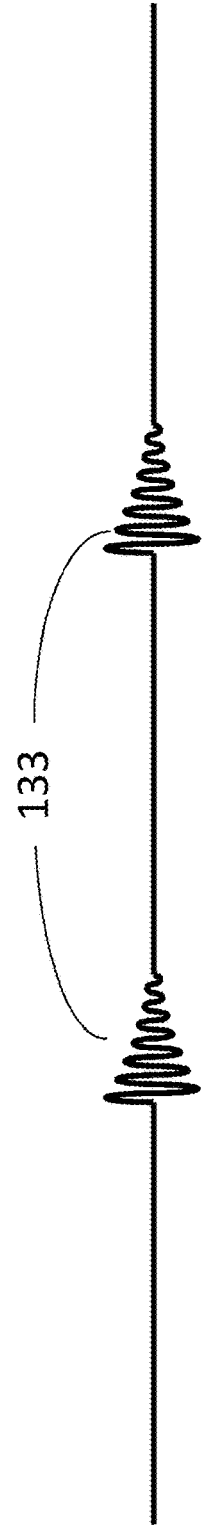
Figure 13A
Figure 13B

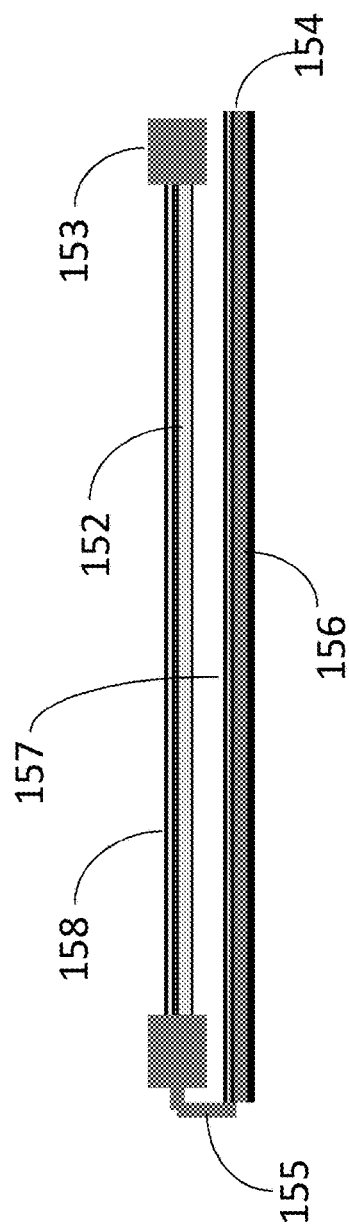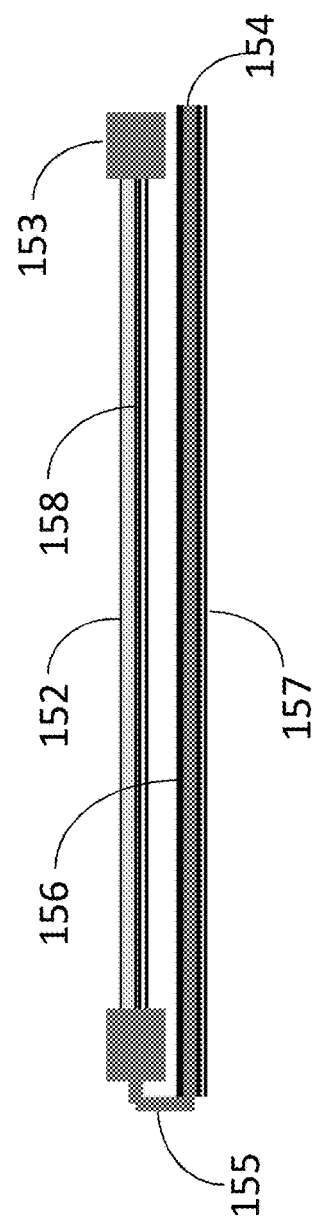
Figure 15A
Figure 15B

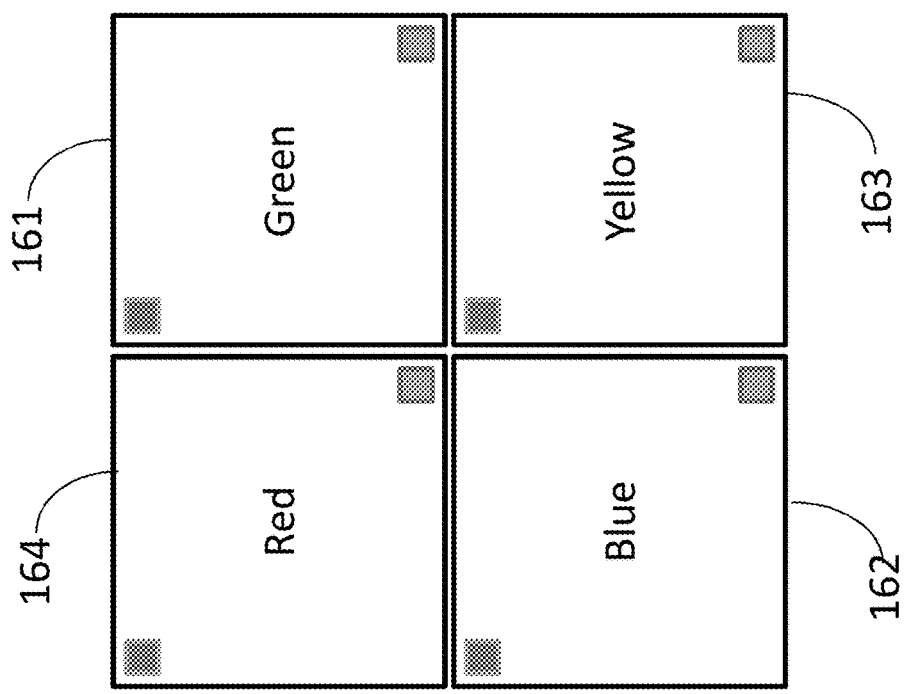

SOLAR ANTENNA ARRAY AND ITS FABRICATION AND USES

CROSS-REFERENCE TO RELATED APPLICATIONS

This application is a continuation-in-part of U.S. patent application Ser. No. 14/582,747, filed on Dec. 24, 2014, the contents of which are incorporated by reference herein in their entirety, and a continuation-in-part of U.S. patent application Ser. No. 13/454,155, filed on Apr. 24, 2012, the contents of which are incorporated by reference herein in their entirety.

FIELD OF ENDEAVOR

Various aspects of this disclosure may pertain to an economical manufacturing process of visible light rectifying antenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739, granted Aug. 27, 1991. However, the dimensions of the antenna limited the frequency until recently, when Gritz, in U.S. Pat. No. 7,679,957, granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such visible light rectennas are generally in the tens of nanometers. While these dimensions can be accomplished by today's deep submicron masking technology, such processing is typically far more expensive than the current solar cell processes, which require much larger dimensions.

Still, as Logan pointed out in U.S. Pat. No. 5,043,739, the efficiency of microwave rectennas can be as high as 40%, more than double that of typical single junction poly-silicon solar cell arrays, and when using metal-oxide-metal (MOM) rectifying diodes, as Pietro suggests, no semiconductor transistors are needed in the array core.

As such, it may be advantageous to be able to utilize the existing processing capability of current semiconductor fabrication without incurring the cost of such manufacturing.

Also, recently, Rice University reported that their researchers created a carbon nanotube (CNT) thread with metallic-like electrical and thermal properties. Furthermore, single-walled carbon nanotube (SWCNT) structures are becoming more manufacturable, as described by Rosenberger et al. in U.S. Pat. No. 7,354,977, granted Apr. 8, 2008. Various forms of continuous CNT growth may have also been contemplated, such as Lemaire et al. repeatedly harvesting a CNT "forest" while it is growing, in U.S. Pat. No. 7,744,793, granted Jun. 29, 2010, and/or put into practice using techniques described by Predtechensky et al. in U.S. Pat. No. 8,137,653, granted Mar. 20, 2012. Grigorian et al. describes continuously pushing a carbon gas through a catalyst backed porous membrane to grow CNTs in U.S. Pat. No. 7,431,985, granted Oct. 7, 2008.

Furthermore, others have contemplated using SWCNTs for various structures such as Rice University's CNT thread as described in "Rice's carbon nanotube fibers outperform copper," by Mike Williams, posted on Feb. 13, 2014 at news.rice.edu/2014/02/13/rices-carbon-nanontube-fibers-outperform-copper-2, magnetic data storage as described by Tyson Winarski in U.S. Pat. No. 7,687,160, granted Mar. 30, 2010, and in particular, antenna-based solar cells are described by Tadashi Ito et al. in US Patent Publication 2010/0244656, published Sep. 30, 2010. Still, Ito et al. did not describe methods to inexpensively construct carbon nanotube solar antennas for efficient conversion of solar energy.

SUMMARY OF VARIOUS ASPECTS OF THE DISCLOSURE

Various aspects of the disclosure may relate to structures of rectifying antenna arrays for converting sunlight into electricity and/or to ways to manufacture such structures, which may utilize self-aligning process steps and molds made using current IC masking techniques to achieve the dimensions required for the antenna connections.

The structure of the antenna array may include an array of carbon nanotube ¼-wavelength antennas connected to power or ground rails, which may be either by direct metal connections or by Metal oxide Carbon (MoC) or Metal insulator insulator Metal (MiiM) diodes. The antennas may be of varied length, with variances and means adjusted for the environment in which they may be used.

In one embodiment, the rows power and ground lines may vary in direction, height and taper to define the random variation in location, length and direction of the carbon nanotube antennas connected between them. An optimal collector may consist of randomly placed ¼-wavelength antennas that may vary from 80 nanometers to 620 nanometers in length. The antenna array may be attached to a plastic surface, which may include a large percentage of thick film metal lines for both collecting the electrical energy and reflecting the light back to the array.

These thick film metal lines may consist of an alloy of one or more of copper, aluminum, silver, and/or other conductive elements.

In one embodiment, a mold may be created by a series of masked anisotropic V-groove etches with subsequent anti-adhesion depositions. A step of the process may include polishing off the resist or etch stop deposition of either silicon nitride or silicon carbide to allow the non-grooved portion of the silicon to be V-groove etched. Alternatively, the etch may be progressive to approximate a V shape of any angle, a U shape or a combination of both.

In another embodiment, the antenna array may be fabricated using the mold in successive metal deposition steps. The mold may be angled or flat when used as a deposition target, and the deposition may be much less than the depth of the V-grooves in the mold. Layers of a polymer and thick film metal may also be deposited on the mold and electrically connected to the array of power and ground lines through a plurality of vias. The vias may be burned by a laser. The laser may be broadcast through a mask. The mask may be sufficiently elastic to align to the pads on the mold by a combination of rotation, translation and deformation. Subsequently, the metal and polymer may be separated from the mold, and carbon nanotubes may be grown between the power and ground lines.

In one embodiment the carbon nanotubes may be grown off of a nickel ball that may be electrically connected to the ground lines, to an oxide layer over the power lines, such that the tip of the carbon nanotube, oxide and metal power line form MoC point contact tunnel diodes.

In another embodiment, the nanotubes may be grown off an oxide layer, each carrying a nickel ball covered in nickel oxide on the tip of the carbon nanotube where they lodge into another oxide layer forming a MiiM diode. Alternatively, the nanotubes may be grown off a metal layer.

In yet another embodiment, the antenna array may be driven with a variable pulsed power supply thereby generating light rather than absorbing it.

In yet another embodiment, an antenna array may consist of regions or sub-pixels, which when turned on, absorb light, but when turned off, reflect light, forming a display that may power itself. Each of the sub-pixels may contain one of a number of reflective colors behind it such that each group of sub-pixels may contain a sufficient number of colors to create a colored display. Each sub-pixel may absorb, reflect or generate light. A pixel may consist of a plurality of groups of sub-pixels, where each group may contain a plurality of sub-pixels with the same reflective color, different from the reflective colors of the other groups within a pixel.

BRIEF DESCRIPTION OF THE DRAWINGS

Various embodiments of the invention will now be described in connection with the attached drawings, in which:

FIGS. 3a, 3b, 3c and 3d are cross-sections of a mold during its fabrication, according to an aspect of the disclosure, FIGS. 4a, 4b, 4c and 4d are cross-sections of the fabrication of carbon nanotube rectannas, according to an aspect of the disclosure, FIGS. 15A and 15B are configurations of antenna array displays with reversible covers, according to an aspect of the disclosure, FIG. 16 is a diagram of an example of a pixel comprised of four colored sections of an antenna array color display, according to an aspect of the disclosure.

DETAILED DESCRIPTION OF VARIOUS ASPECTS OF THE DISCLOSURE

Aspects of this disclosure are now described with reference to FIGS. 1-17, it being appreciated that the figures may illustrate the subject matter of various embodiments and may not be to scale or to measure.

Figure 1:
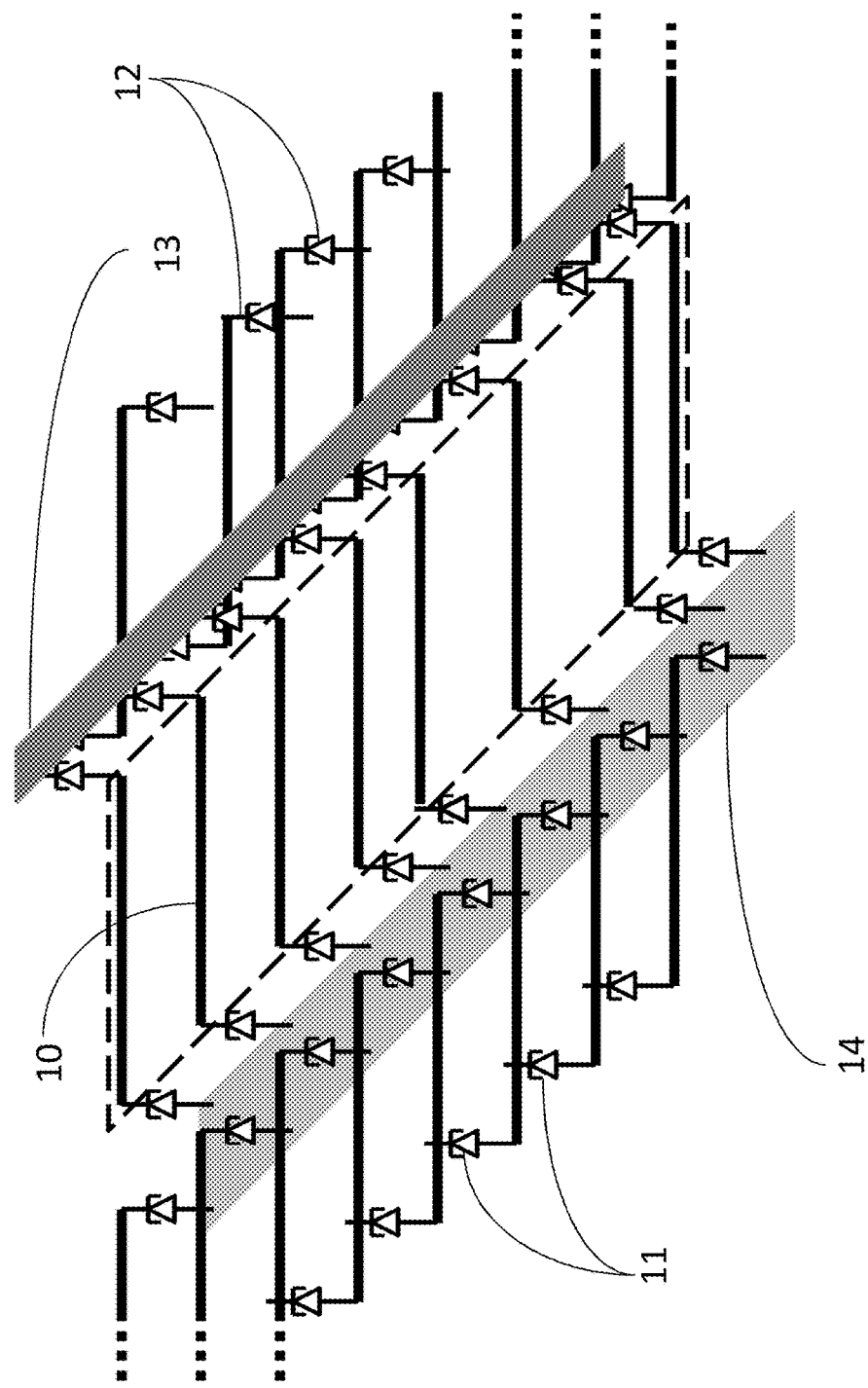
FIG. 1 is a conceptual diagram of an antenna array according to an aspect of the disclosure.

A conceptual diagram of an example of an aspect of this disclosure is shown in FIG. 1. The core of a solar antenna array may have rows of antennas 10, separated by power lines 13 and ground lines 14. The power and ground lines may be respectively coupled to the antennas by tunnel diodes 11 and 12. When the antennas are excited by visible light, the current may flow from the ground line to the power line, thus producing half-rectified electrical energy. It may be understood by one well-versed in the state of the art that additional circuitry, such as switching and decoupling capacitors, may be included in the periphery of the solar antenna array, as may be desired to produce stable DC power in voltages suited for commercial applications.

For antennas to efficiently receive visible light, it may be advantageous for them to be either ¼ or ½ of the wavelength of the light being captured, depending on whether or not the antenna is coupled to an existing ground plane. In order to produce such small structures, without expensive masking operations, one may create a mold with which to manufacture the power and ground lines, and grow carbon nanotube antennas between them.

Figure 2:
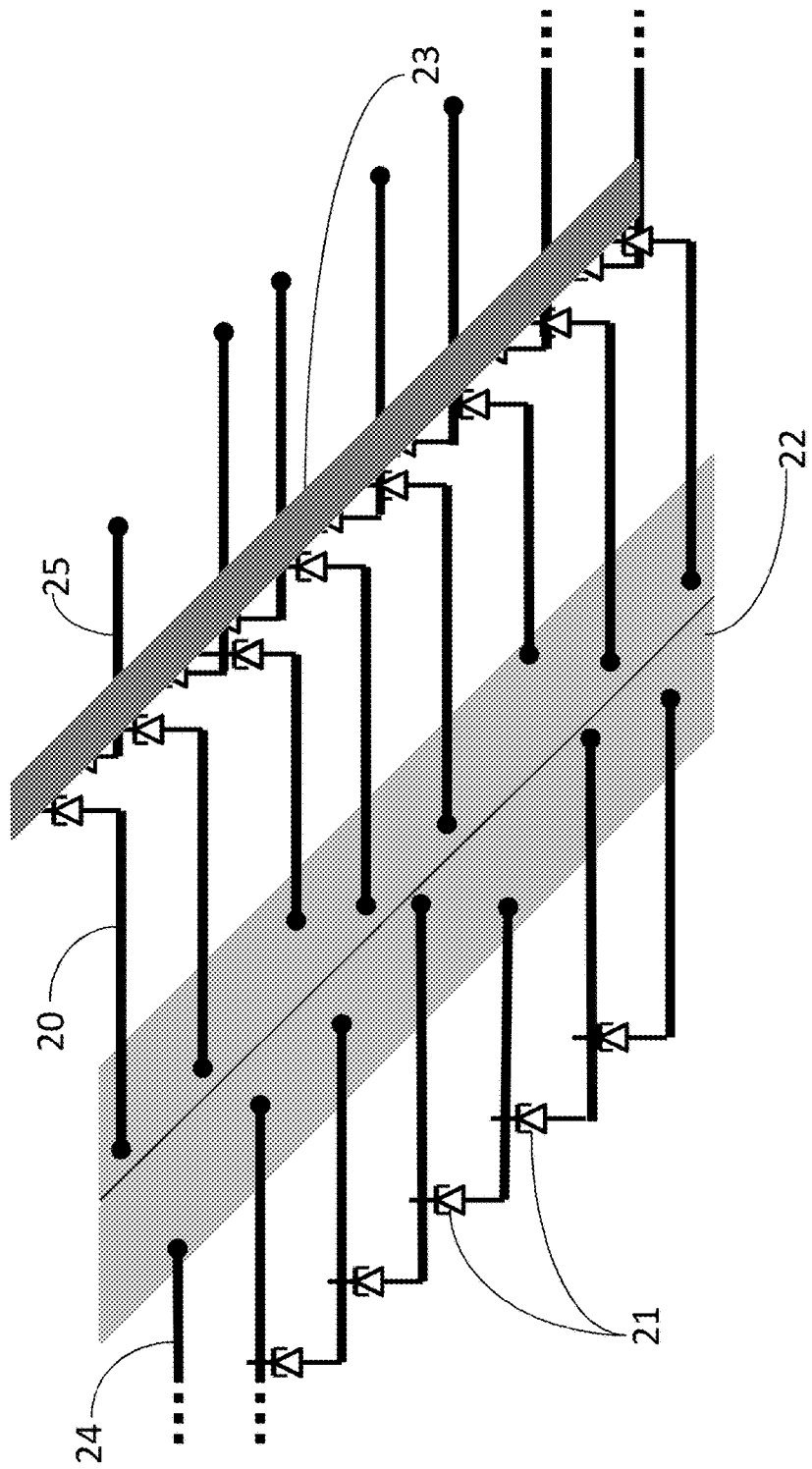
FIG. 2 is another conceptual diagram of an antenna array according to an aspect of the disclosure.

Reference is now made to FIG. 2, another conceptual diagram of an antenna array. Rectifying MOM diodes 21 may be connected to the power lines 23 and the antennas 20, while the other ends of the antennas, may be directly connected to the ground lines 22. Since the random locations of catalytic balls may determine the location of the carbon nanotubes, the antennas 20,24 connections to the ground line 20 may not align. In this manner, the carbon nanotube antennas may form an array of randomly placed ¼- or ½-wavelength antennas of varying lengths 25,20. The diameter of the catalytic balls may determine the diameter of the nanotubes, the structure or chirality of the carbon nanotubes may in part be determined by an applied magnetic field, and the direction of growth of the nanotubes may be determined by the direction of the electric field between the power and ground lines, with the connections being made in order of their length, as may be seen in FIG. 5d.

Reference is now made to FIGS. 3a through 3d, which are cross-sections of an example of a mold during its fabrication. A regular width pattern may be exposed into resist 31, and a short vertical plasma etch followed by a subsequent V-groove etch may performed, leaving a first set of V-grooves 30 between the residual resist. Optionally, a p-doped wafer may be used to construct the mold, and a selective n-doped diffusion may be performed 38 on the initial V-grooves. Thereafter, the cleansed wafer may be coated with a thin layer of a non-adhesive material, such as Silicon Nitride (SiN) or Silicon Carbide (SiC), coating the first set of V-grooves 33 and the top surface of the wafer as shown in FIG. 3b. After polishing the wafer to remove the non-adhesive material on the un-etched surface 32, a second set of V-grooves 34 may be etched, leaving the first set 35 protected by the non-adhesive material, as shown in FIG. 3c. Finally an additional layer of non-adhesive material may be added to the wafer, covering all the V-Grooves 36, as seen in FIG. 3d. The first set of V-grooves 37 may be etched wider than the second set of V-grooves to compensate for the different thicknesses of the non-adhesive material. Alternatively, different non-adhesive materials, such as Silicon Nitride and Silicon Carbide, may be respectively deposited in the first 35 and second 34 sets of V-grooves.

Reference is now made to FIGS. 4a through 4d, cross-sections of an example of an antenna array during its fabrication, according to an aspect of the disclosure. Optionally, a thin layer of a conductor may be vapor deposited followed by a carbon nanotube catalyst, such as iron, nickel, or some other magnetic metal, or may be arc sputtered onto the mold, forming a layer of small balls 41 in the V-grooves. The conductor, such as gold, silver, platinum, aluminum or some other suitable metal or alloy, may be again deposited in the V-grooves such that the catalytic balls 41 may be suspended within the conductor 42, as seen in FIG. 4a. Alternatively, the PN diode 38 created between the two sets of V-grooves in the mold may be reverse-biased, which may selectively deposit the carbon nanotube catalyst in some of the V-grooves 47. A polymer, such as polyamide or some other suitable material 43, may then be coated over the mold, as seen in FIG. 4b. After partially curing the polymer 43, vias may be created through the thin polyamide layer (not shown) and a thick film of metal paste, such as copper aluminum 40, may be stenciled onto the polymer, followed by a thicker coat of the same or another polymer 49. The structure may be cured and subsequently removed from the mold. A short etch may expose the catalytic balls 45 on the ground lines or ridges as shown in FIG. 4c. Optionally, a layer of oxide may be grown or deposited on the power ridges 48 as shown in FIG. 4d. Thereafter, the power and ground ridges may be heated and respectively charged to positive and negative voltages, an optional magnetic field may be applied, and a hydrocarbon, such as methane or acetylene, may be introduced into the deposition chamber, along with other less reactive gasses, to grow carbon nanotubes between the power and ground ridges, as shown in FIG. 4d. The nanotubes may grow from the catalytic balls on the negatively charged ground lines to the oxide 48 on the positively charged power lines. Subsequent to connecting the nanotubes to the conductor, the conductor may be heated, which may anneal the carbon nanotubes into the conductive material.

Figure 5A:
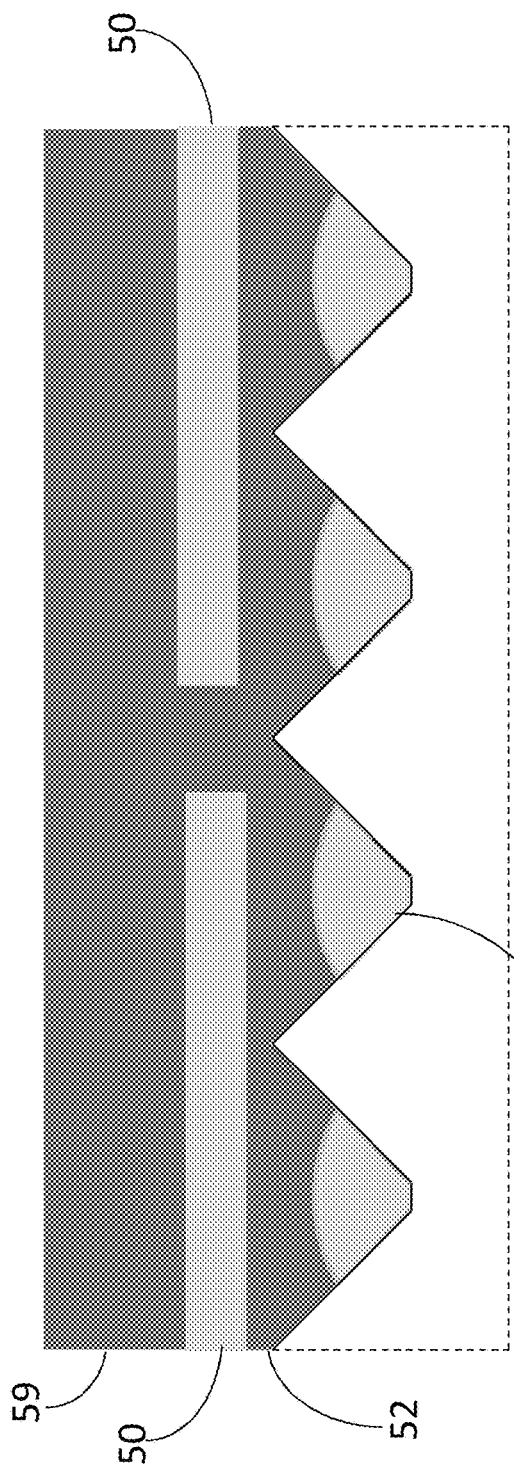
FIGS. 5a, 5b, 5c and 5d are cross-section of another fabrication of carbon nanotube rectannas, according to an aspect of the disclosure.
Figure 5B:
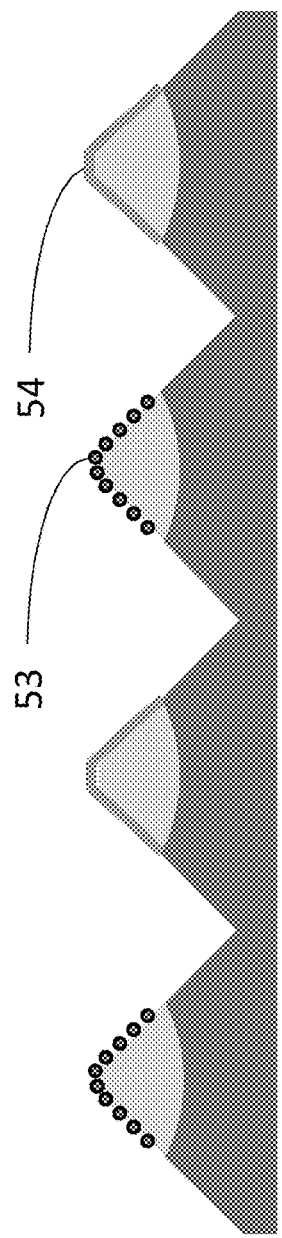
Figure 5C:
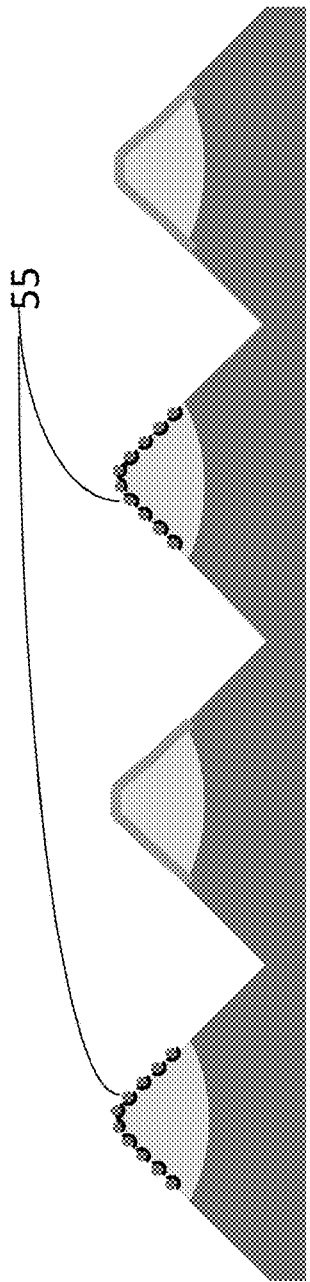
Figure 5D:
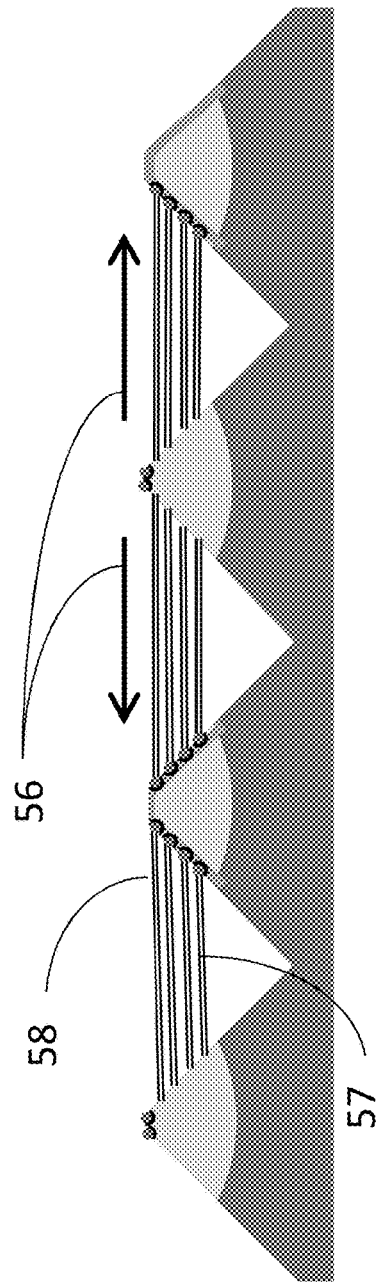

Reference is now made to FIGS. 5a through 5d, cross-sections of an example of an antenna array during its fabrication, according to another aspect of the disclosure. In this embodiment the V-grooves may be filled with just a conductor 51, covered with a polymer 52, stenciled lines of conductive paste 50 and a thick layer of polymer 59 as shown in FIG. 5a, and removed from the mold. The power and ground ridges may then be respectively charged to negative and positive voltages, from the conductive paste lines on the back, and charged oxidized catalytic balls may be selectively deposited on the ground ridges 53, after which oxide may be grown or deposited on the power ridges 54 that may be clear of the catalytic balls as shown in FIG. 5b. Thereafter, the carbon nanotubes may grow in opposite directions 58 from the ground ridges toward the metal on the power ridges, carrying the catalytic balls on the tips of the carbon nanotubes, such that the shortest carbon nanotubes 57 may connect lower on the power ridges and the longer carbon nanotubes 58 may connect higher, as seen in FIG. 5d.

The combination of conductor, catalytic ball and the thin oxide layer may form a metal insulator insulator metal (MIIM) diode.

Figure 6A:
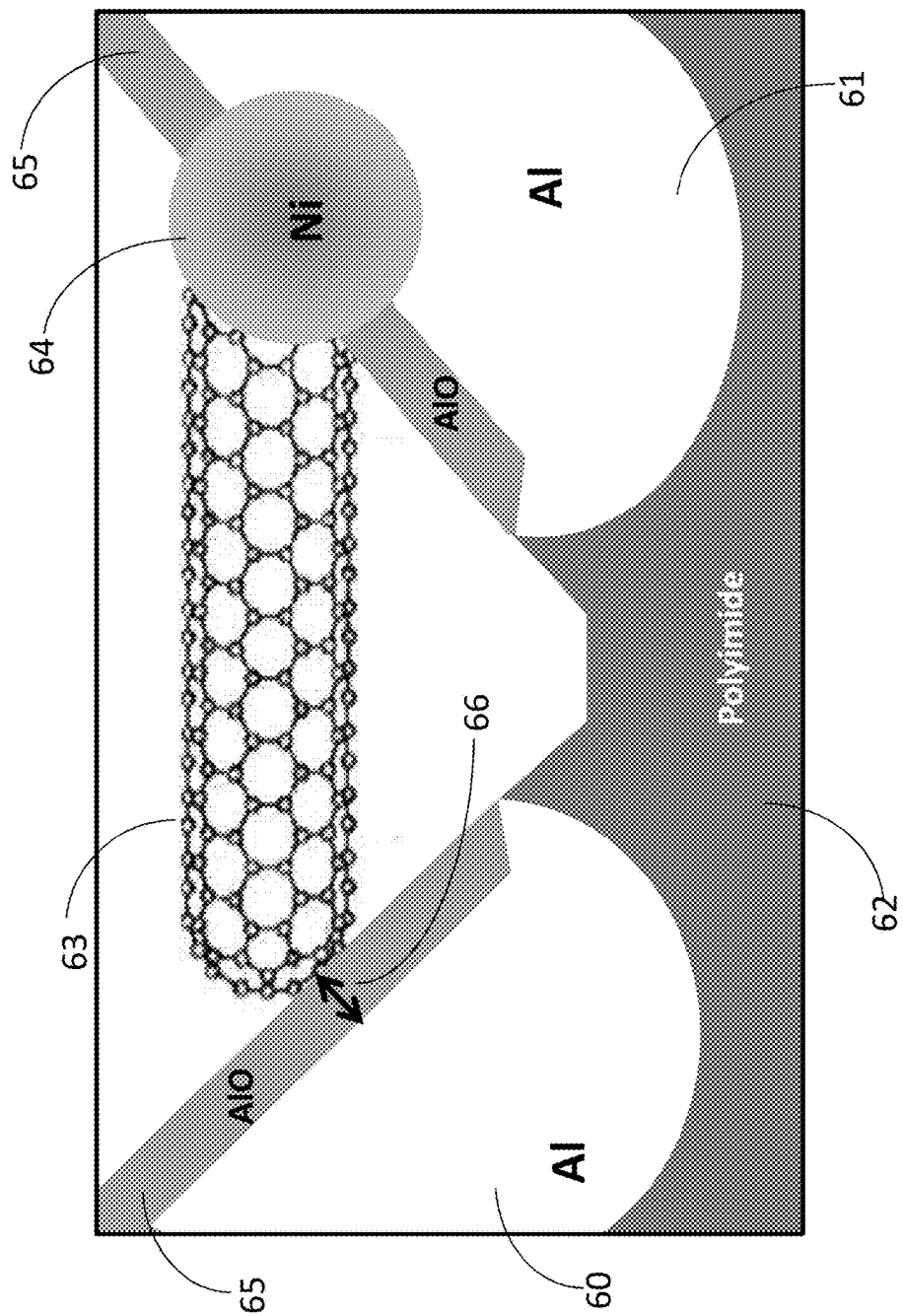
FIGS. 6A, 6B, 6C, 6D and 6E are diagrams of carbon nanotube rectannas with various diodes on one or both ends of the antennas, according to various aspects of the disclosure.
Figure 6B:
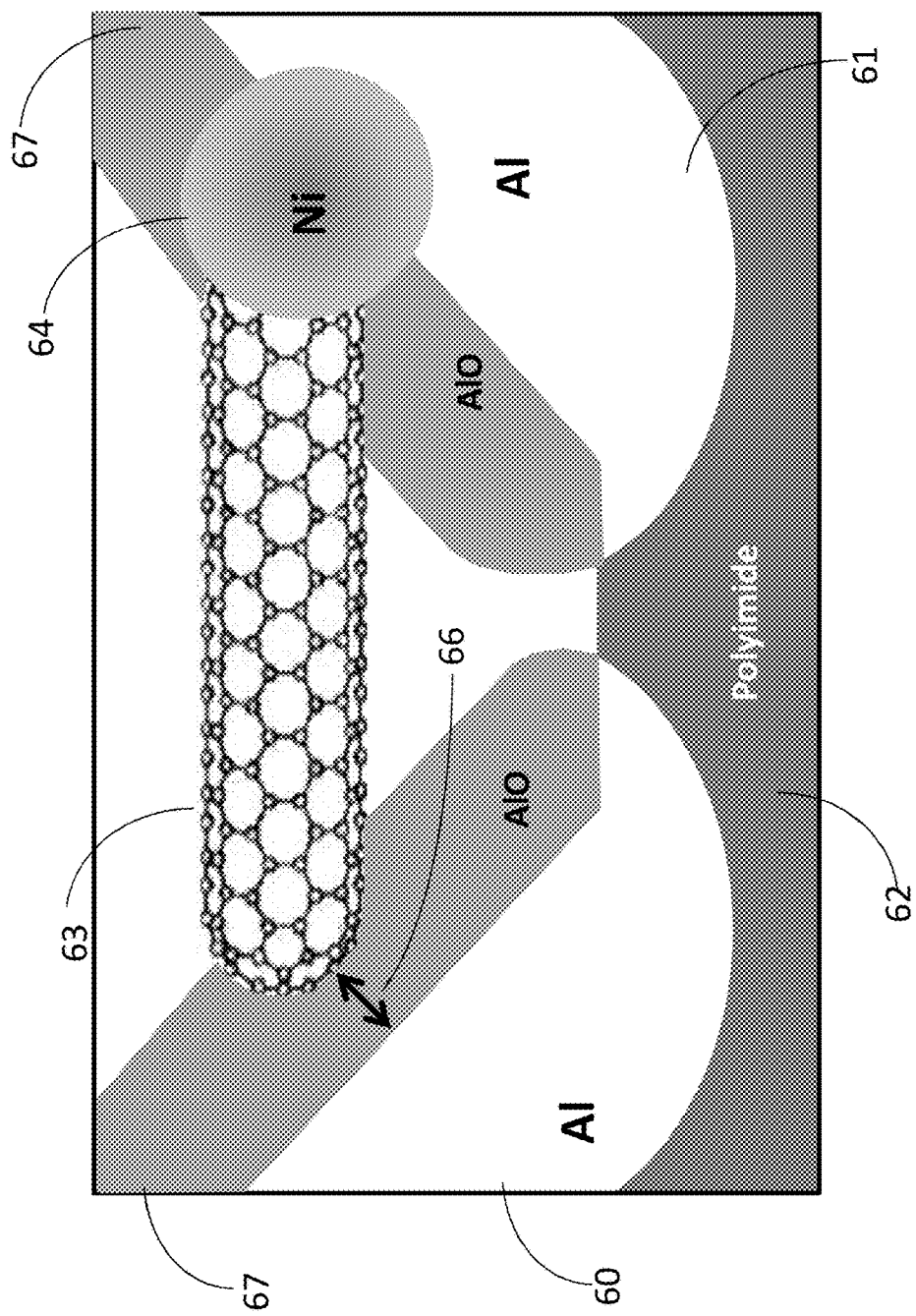
Figure 6C:
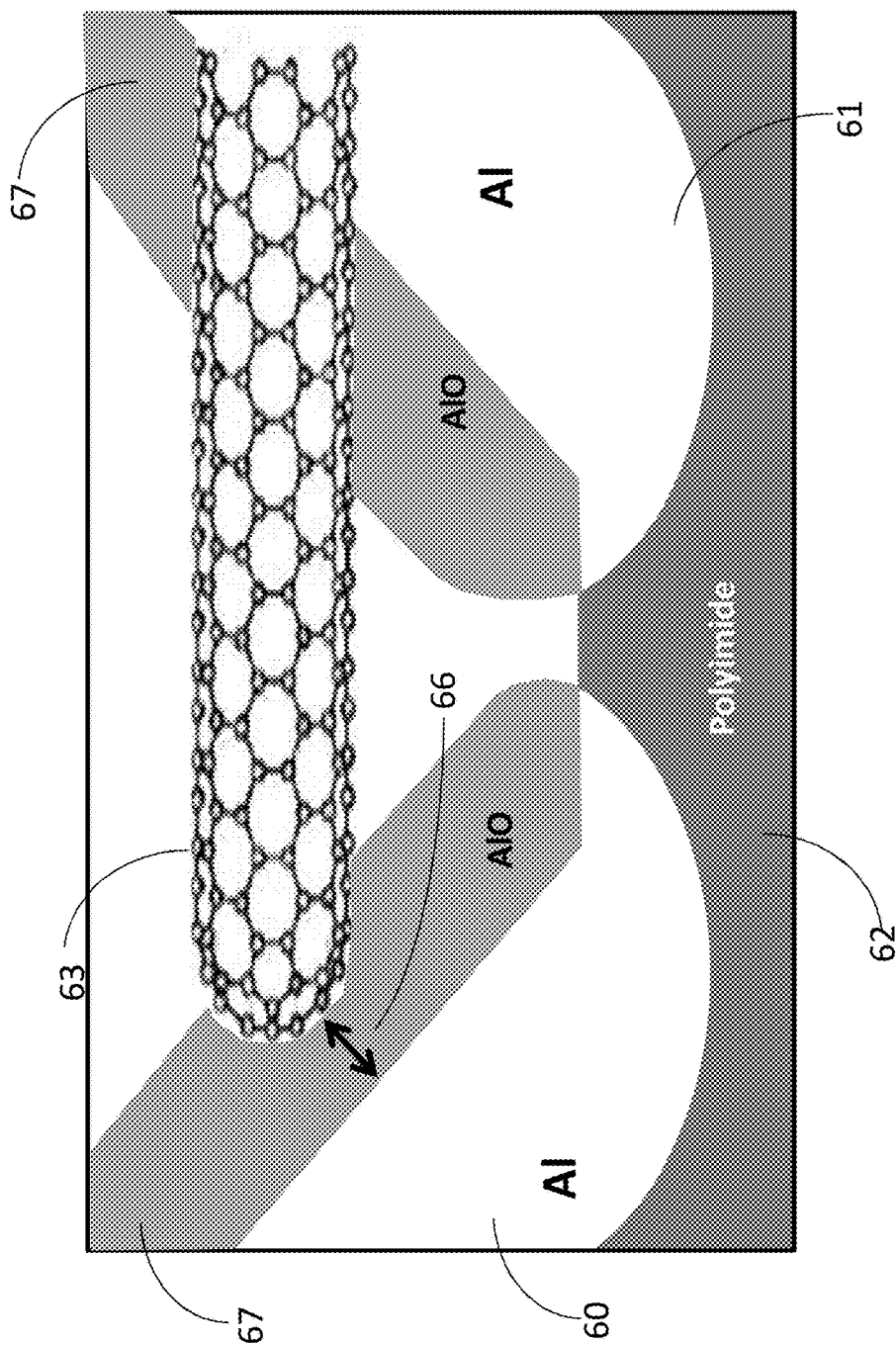

Reference is now made to FIGS. 6A-6E, diagrams of carbon nanotube rectennas with various forms of diodes on one or both ends of the antennas. In one example, as shown in FIG. 6A, a MoC tunnel diode 66 may be formed by growing a carbon nanotube 63 from a nickel ball 64 embedded in a grounded aluminum ridge 61, or other suitably conductive metal, across to an oxide coating 65 on a second aluminum ridge 60, or similarly suitable conductive metal, separated by a base layer of polyimide or other suitably insulating material 62. The carbon nanotube 63 may have a single-walled armchair chirality structure or may have a multi-walled structure. It is further contemplated that additional oxide may 67 may be grown around the carbon nanotube 63, as shown in FIG. 6B, to suitably anchor the ends of the antenna. Alternatively, the nickel ball 64 may be carbonized and dissipated from the carbon nanotube 63 during its growth, leaving the base of the carbon nanotube directly connected to the aluminum 61, as shown in FIG. 6C.

Figure 6D:
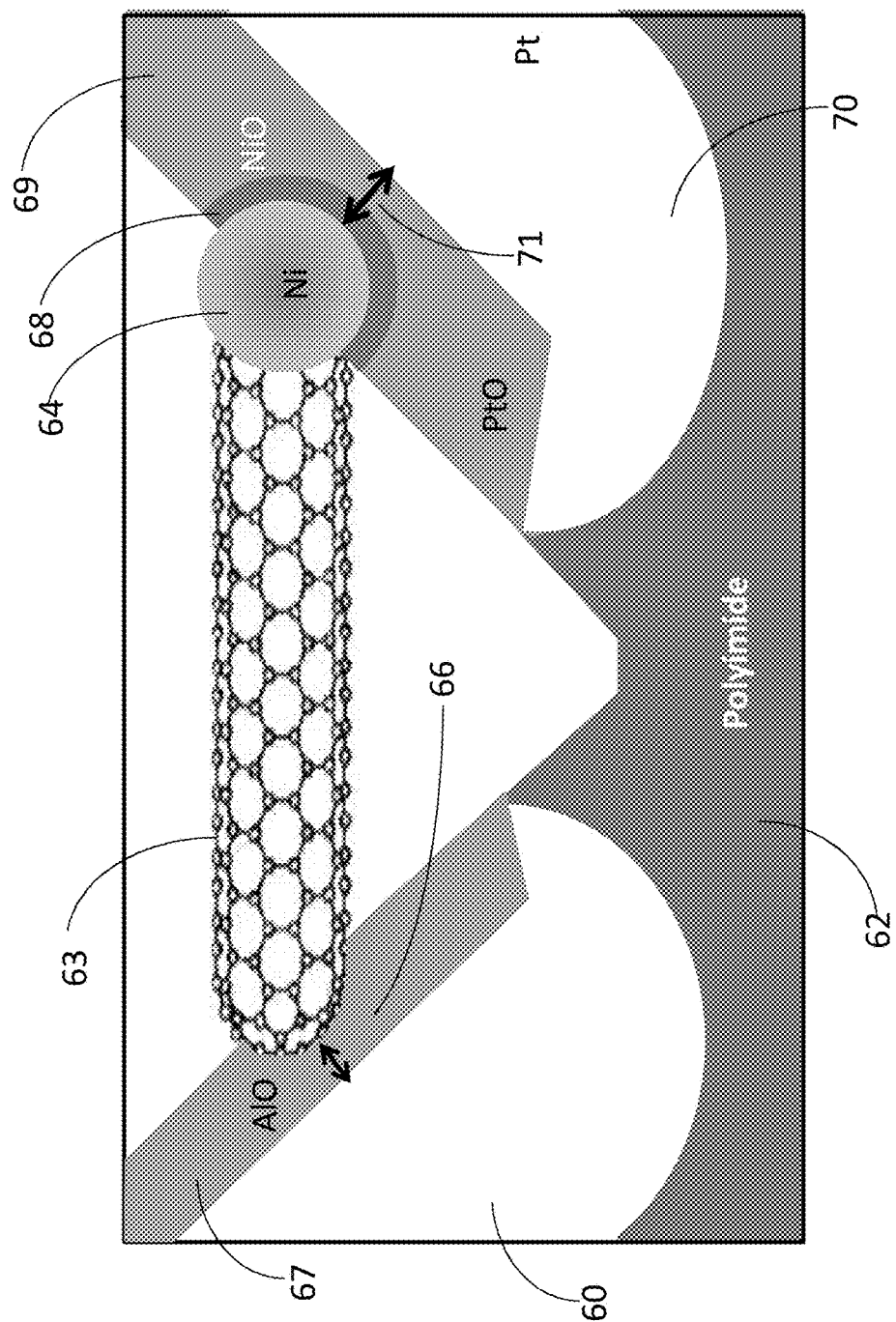
Figure 6E:
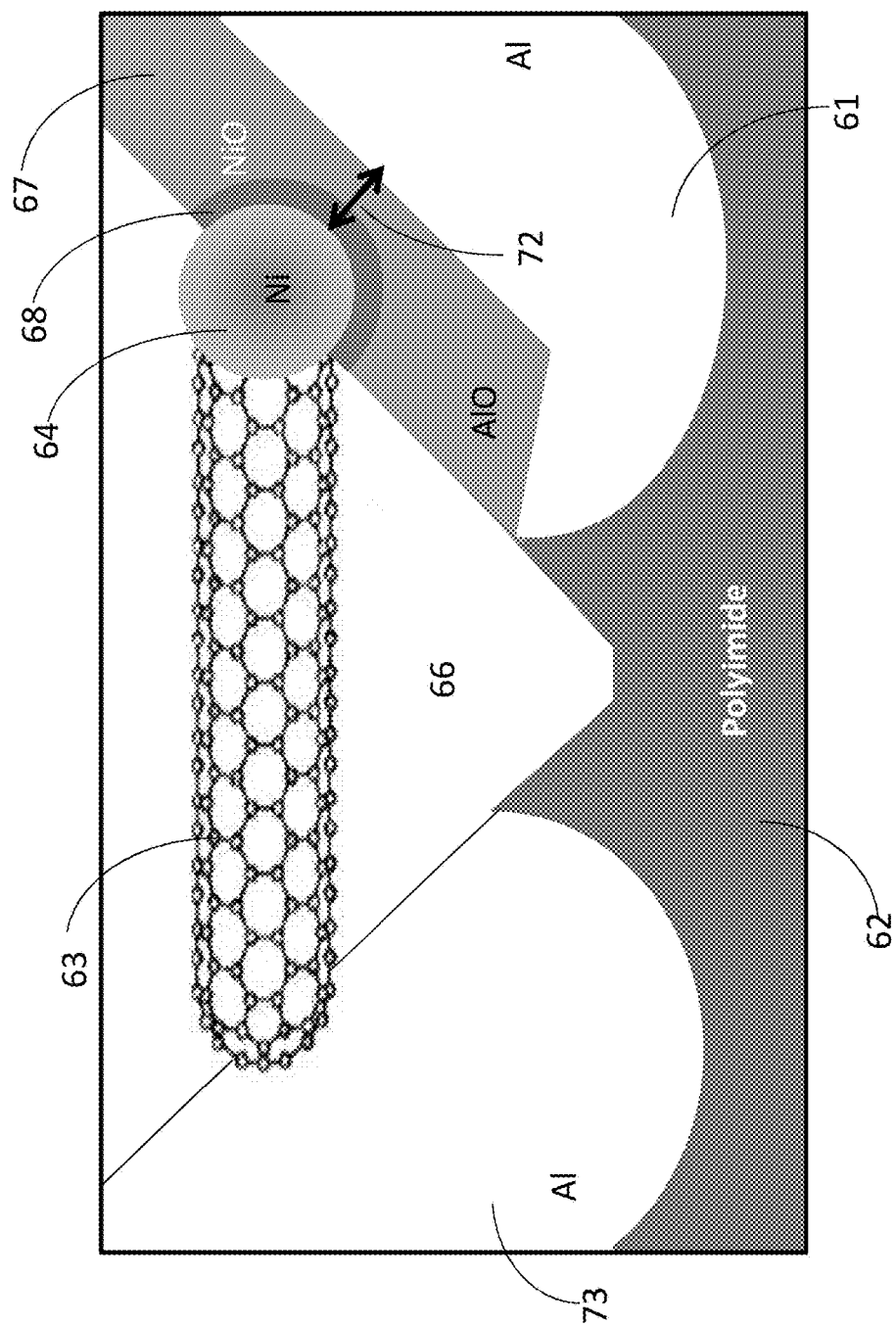

In another example of a fully rectifying carbon nanotube antenna, as shown in FIG. 6D, one end of the carbon nanotube 63 may form a MoC diode 66, and the other end may form a MIIM diode 71. The metal ridges 60,70 may be similar or different metals. The MIIM may consist of the nickel ball 64, a nickel oxide layer 68, another metal oxide layer, such as a platinum oxide layer 69, and a corresponding metal, such as platinum 70. It is further contemplated that a half-rectifying carbon nanotube antenna, as shown in FIG. 6E may be directly connected to a grounded metal ridge 73, and the MIIM 72 may be constructed of an oxide 67 and metal 61 of the same type as on the grounded metal ridge 73.

Figure 7:
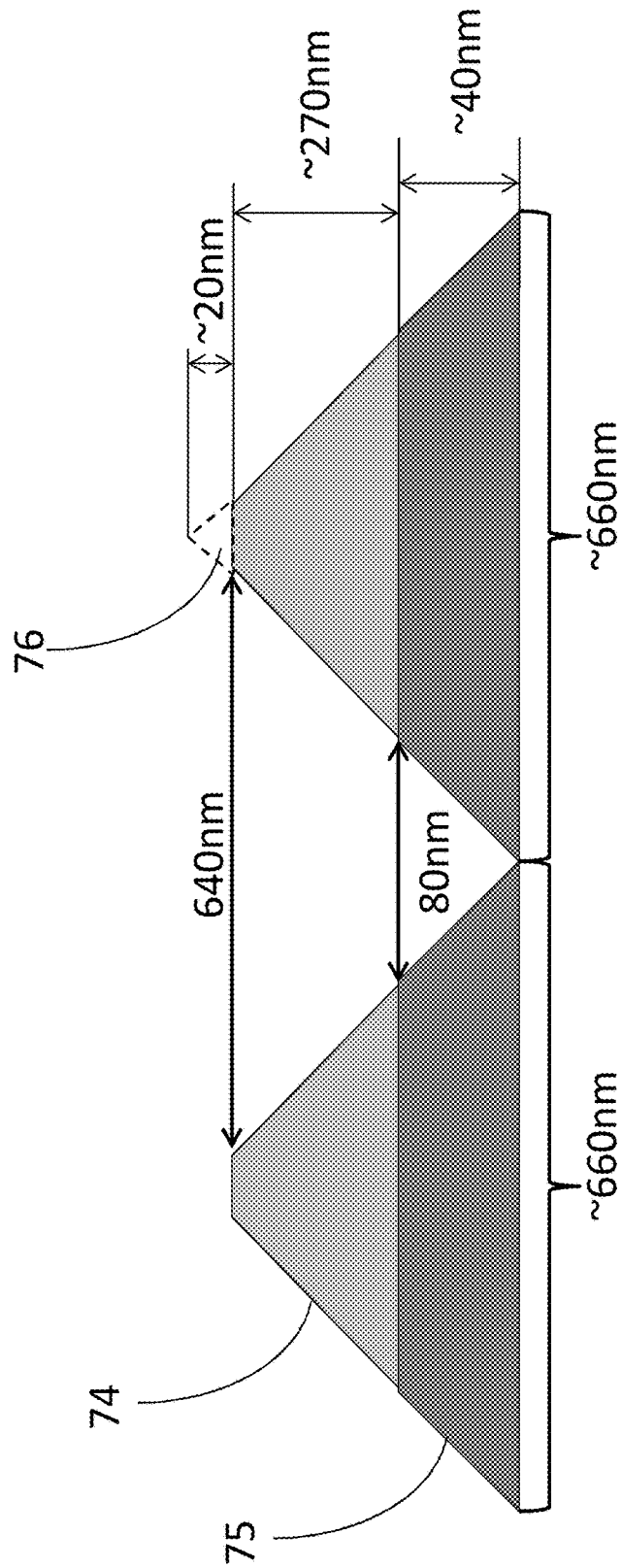
FIG. 7 is an annotated cross-section of an antenna array, according to an aspect of the disclosure.

Reference is now made to FIG. 7, an annotated cross-section of an example of an antenna array, according to an aspect of the disclosure. An antenna's efficiency to absorb electromagnetic frequencies may be significantly lower, the farther the electromagnetic frequency varies from the ideal frequency of the antenna, or the farther the electromagnetic waves are from the antenna. These effects may significantly limit the efficiency of a regular two-dimensional array of antennas with varying lengths. In order to absorb an optimal amount of the visible and infrared solar energy, the antennas may need to vary in length between 80 and 640 nanometers. The nanotubes may grow to distances between 80 and 640 nanometers in the direction of an electric field, which may be applied between conductors containing catalytic balls. The amount of growth may be related to strength of the electric field and the density of the catalytic balls, which may be chosen to maximize the efficiency of the resulting antennas. The power and ground ridges of a solar antenna array may be constructed by depositing ~270 nanometers 74 of catalytic balls and metal, followed by ~40 nanometers of an insulating polymer 75, using a mold with V-grooves that may have been constructed using an inexpensive mask with ~½ micron dimensions, and may be coated with Silicon Nitride, Silicon Carbide and/or some other material that may be non-adhesive to the deposited conductor. The resulting power and ground ridges may be as much as ~20 nanometers 76 shallower than the originally etched V-grooves, e.g., due to the coating and any optional etching.

Figure 8:
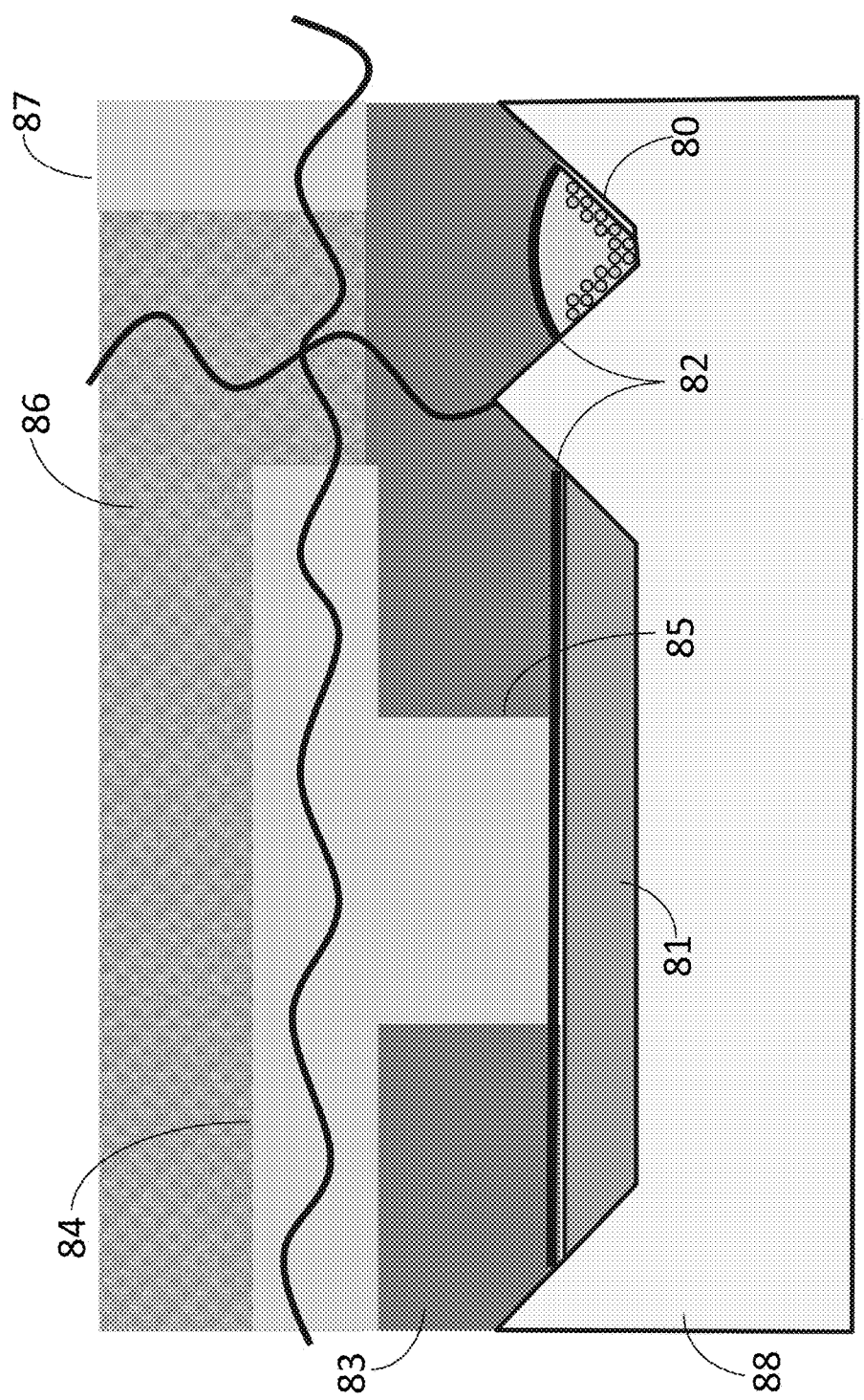
FIG. 8 is a cross-section of a partially processed antenna array, according to an aspect of the disclosure.

Reference is now made to FIG. 8, a cross-section of a partially processed antenna array. In addition to the V-grooves 80 partially filled with a metal and some with nickel balls, larger pad structures 81 may be filled with a metal, and all the metal may be covered with a thin layer of a reflective high melting temperature "barrier" metal 82, such as titanium or tungsten. The pad may be one or more microns square. A fine pure polymer 83 may be vapor-deposited and may cover the metal structures with enough polymer to at least cover the depressions in the mold. The polymer layer may be less than a micron thick. After partially curing the polymer while still on the mold, vias 85 may be burned through the thin polymer layer down to the "barrier" metal 82. A film of metal paste 84, such as aluminum copper, may then be stenciled on the polymer and into the vias 85. The film 84 may be tens of microns thick. A thicker, lower-grade polymer 86 may then be spun on the metal paste 84, leaving some portions 87 of the metal paste 84 exposed. The stenciled lines and spaces may be tens of microns wide. This polymer back 86 may be one or more mils (~25 microns) thick. After curing the metal paste and polymer, the polymer sheet 83, 86 with the metal ridges 80 and the metal pads 81 may be removed from the mold 88 using a combination of semi-vacuum, electrostatic forces and/or unaligned deformation of the mold and polymer structure with some combination of vacuum chucks, clamps or adhesives.

Figure 9:
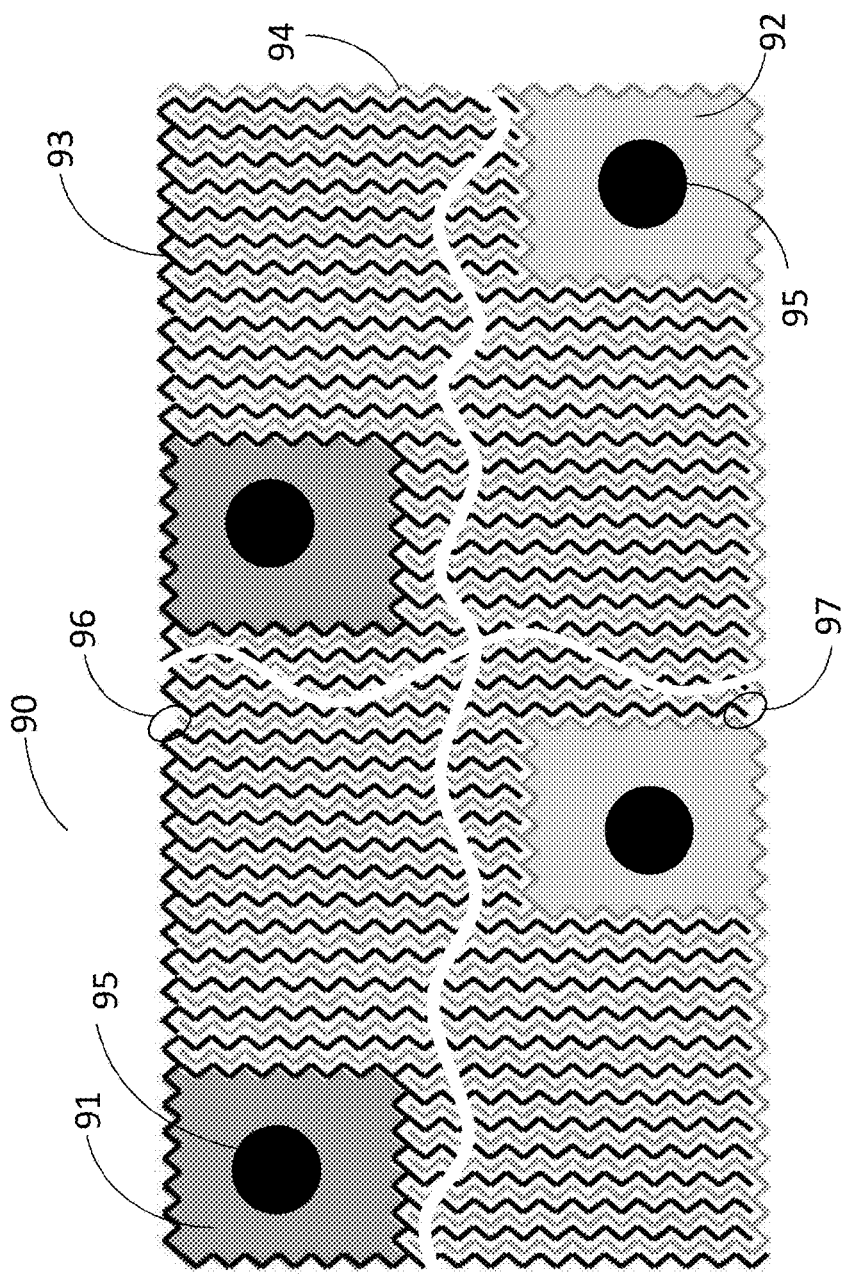
FIG. 9 is a top view of a section of an antenna array, according to an aspect of the disclosure.

Reference is now made to FIG. 9, a top view of a section of an example of an antenna array 90. The vias 95 may be aligned to connect the power 91 and ground 92 pads, which may be much farther apart than implied by the figure, to stenciled thick film power and ground lines above them. The power ridges 93 and ground ridges 94 may radiate out from their respective pads. The power 93 and ground 94 ridges may zig-zag to orient the carbon nanotube antennas locally in all directions, which may increase the efficiency of capturing unpolarized light, or light of varying polarization.

Figure 10:
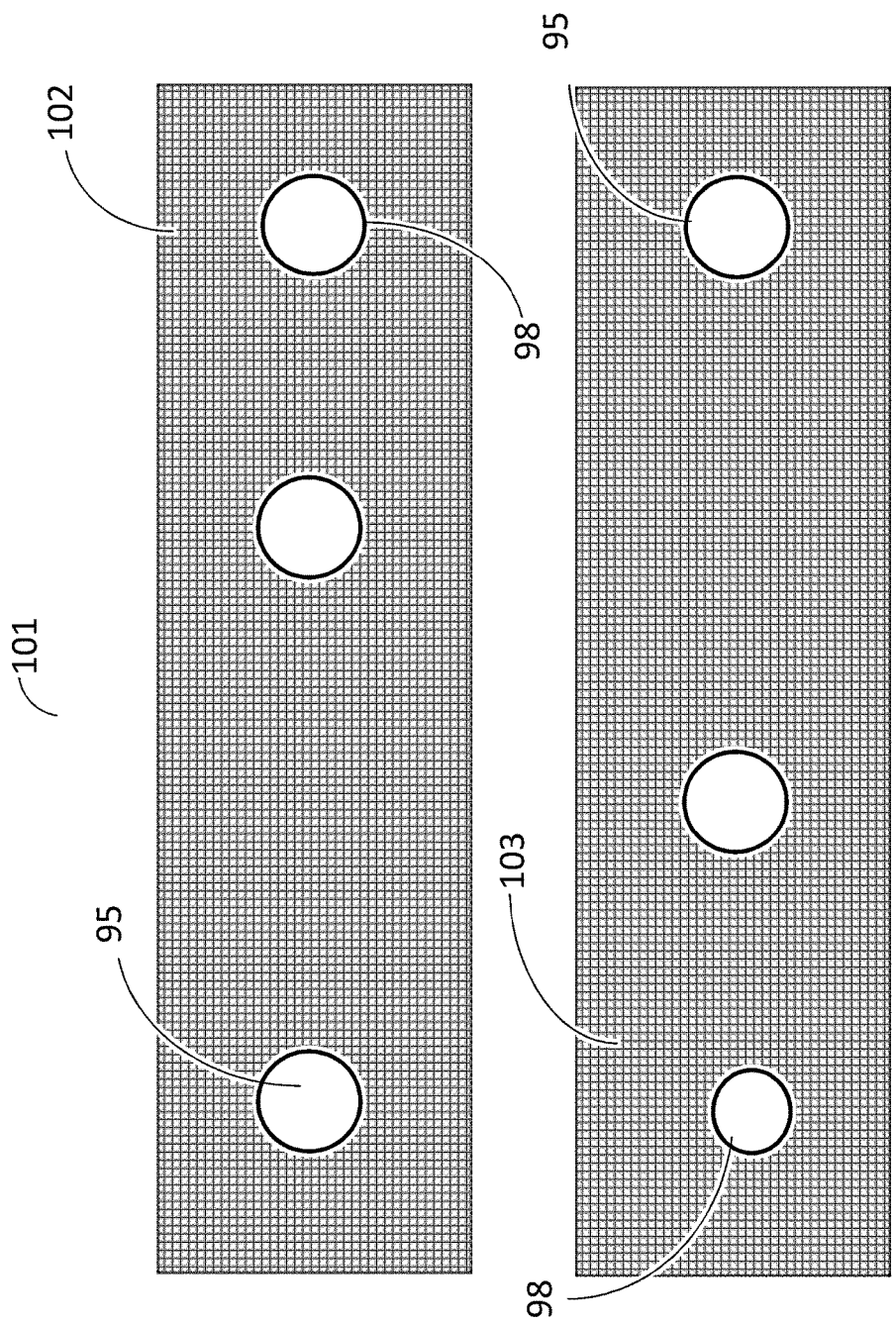
FIG. 10 is a top view of the thick film layer, according to an aspect of the disclosure.

Reference is now made to FIG. 10, an example of a top view of the stenciled thick film layer 101 between layers of polymer. The layer 101 may cover over 90% of the surface of the polymers and may be comprised of multiple power 102 and ground 103 lines, each with vias 95 to the underlying pads, 91 and 92 of FIG. 9. Because of the high percentage of coverage, there may also be adhesion holes 98 periodically placed within the ridges to help adhere the upper and lower polymer layers together.

Figure 11:
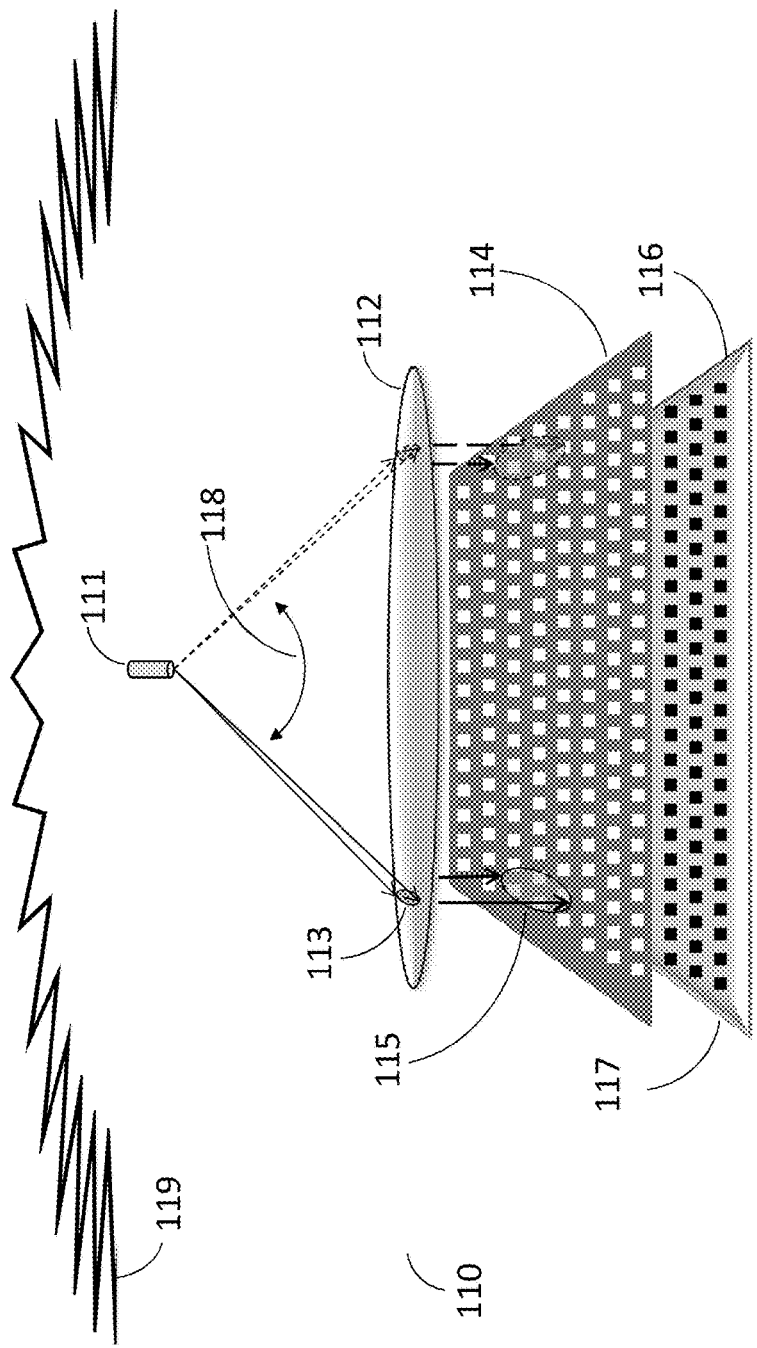
FIG. 11 is a cross-section of a mask based laser via burning apparatus.

Reference is now made to FIG. 11, a masked laser via burning apparatus 110, according to an aspect of this disclosure. A single solar cell may have between 100,000 and 1,000,000 vias to burn, each requiring from one to 50 microns of X and/or Y precision. Furthermore, rotating or rapidly accelerating a partially fabricated solar cell at speeds required to center a laser on each pad and burn its via in a timely manner may cause the partially fabricated solar cell to prematurely separate from the its mold. Alternatively, it may be desirable to move the laser or beam while leaving the mold and partially fabricated solar cell stationary. Still, given such a large number of vias, individually aligning the laser beam and burning each via may still take an unacceptably long time. It may, therefore, be useful to align a via mask to the partially fabricated solar cell and to a scan large, but adequately energetic laser spot across a mask aligned to burn each individual via onto each pad in the solar cell using the apparatus 110. The apparatus may be comprised of a moving laser or maser 111, which may shine a spot 113 onto a lens 112. The lens may then redirect the spot 115 onto a region of an aligned mask 114, such that the spot may simultaneously burn a plurality of vias 116 on the partially fabricated solar cell 117. The laser 111 may scan 118 the spot 113 across the mask at a rate sufficient to burn every via defined by the mask 114. It is further contemplated that the frequency of electromagnetic radiation being generated by the laser or maser may be optimally absorbed by the polymer to rapidly burn the vias. It is also contemplated that the mask 114 may be constructed out of materials, which may optimally reflect the frequency of electromagnetic radiation that may be used to burn the vias, which may be absorbed, for example, by a larger canopy 119 with adequate heat-dissipation properties, while keeping the temperature of the mask 114 stable.

In another example, the mask 114 may be eliminated by constructing the pads such that the electromagnetic energy from the scanning spot may be sufficient to burn vias above the pads 91 and 92, as shown in FIG. 9, but not sufficient to burn the polymer elsewhere. This may be accomplished by concentrating the reflected electromagnetic energy above the pads, while dispersing the reflected electromagnetic energy away from the other structures on the mold, because the reflective layer 82 in FIG. 8 may be relatively flat on the pads 81, as compared to a relatively curved layer 82 on the ridges 80 shown in FIG. 8.

Figure 12:
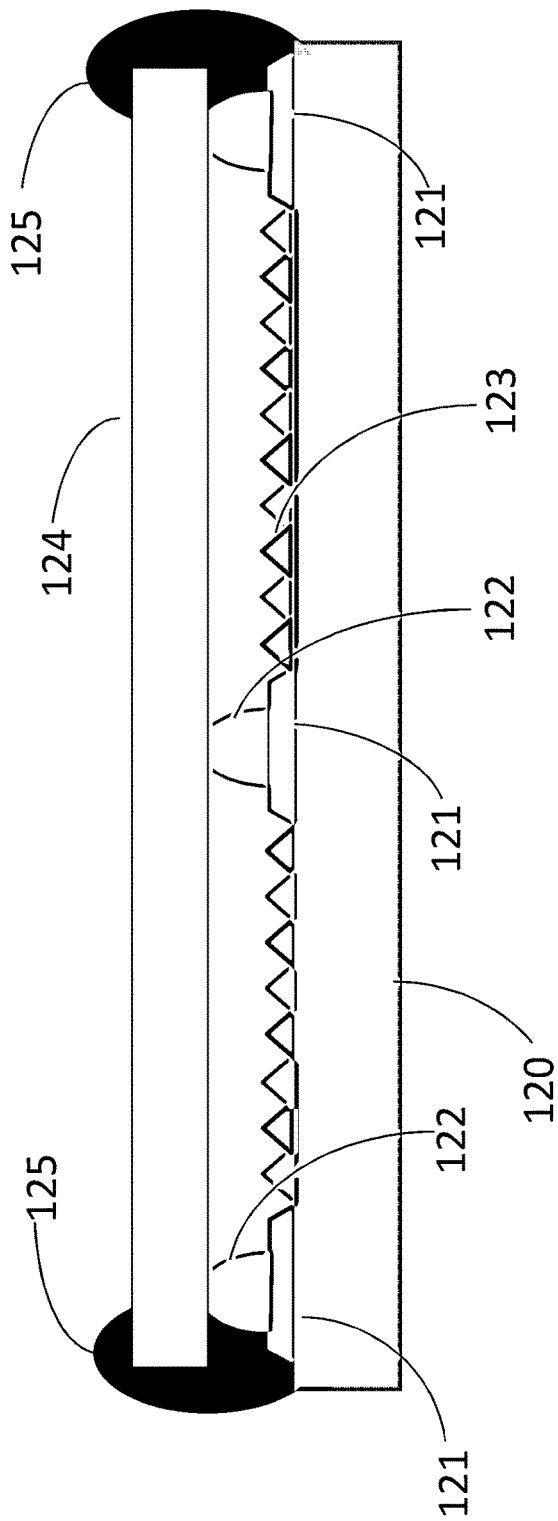
FIG. 12 is a completed antenna array with a glass cover, according to an aspect of the disclosure, 13A and 13B are diagrams of pulses that may be applied to the power lines and their resulting antenna oscillations.

Reference is now made to FIG. 12, a cross-section of an example of an antenna array with a cover plate. Large power and ground pads 121 may be placed across the antenna array 120, over which may be added polyimide or adhesive posts 122 between the power and ground ridges 123 on the antenna array 120. These posts 122 may support a transparent glass (or other material sufficiently transparent to permit light to pass through) plate 124, which may be placed to protect the antenna array. Finally a sealing material 125 may be applied to seal the antenna array 120 to the glass plate. It is further contemplated that a plurality of antenna arrays 120 may be placed on a single glass plate, with the sealing material 125 between at least two antenna arrays 120 and the glass plate 124.

In yet another embodiment the antenna array may be pumped in a forward-biased manner to induce oscillations in the carbon nanotube antennas, which may thereby generating light. Reference is now made to FIGS. 13A and 13B, illustrative examples of pulses applied to the power lines and the resulting antenna oscillations. By issuing high frequency pulses 131 to the power lines of the solar array, the individual antennas may be stimulated by the front edges of the pulses 132, which may cause them to resonate 133 for some period of time thereafter, thereby issuing a broad spectrum of light in declining intensity. Furthermore, the duration of the pulses may relate to the rate of decline in the oscillations. In this manner, the frequency and/or the duty cycle of the pulses may directly translate to the amount of light generated.

Figure 14A:
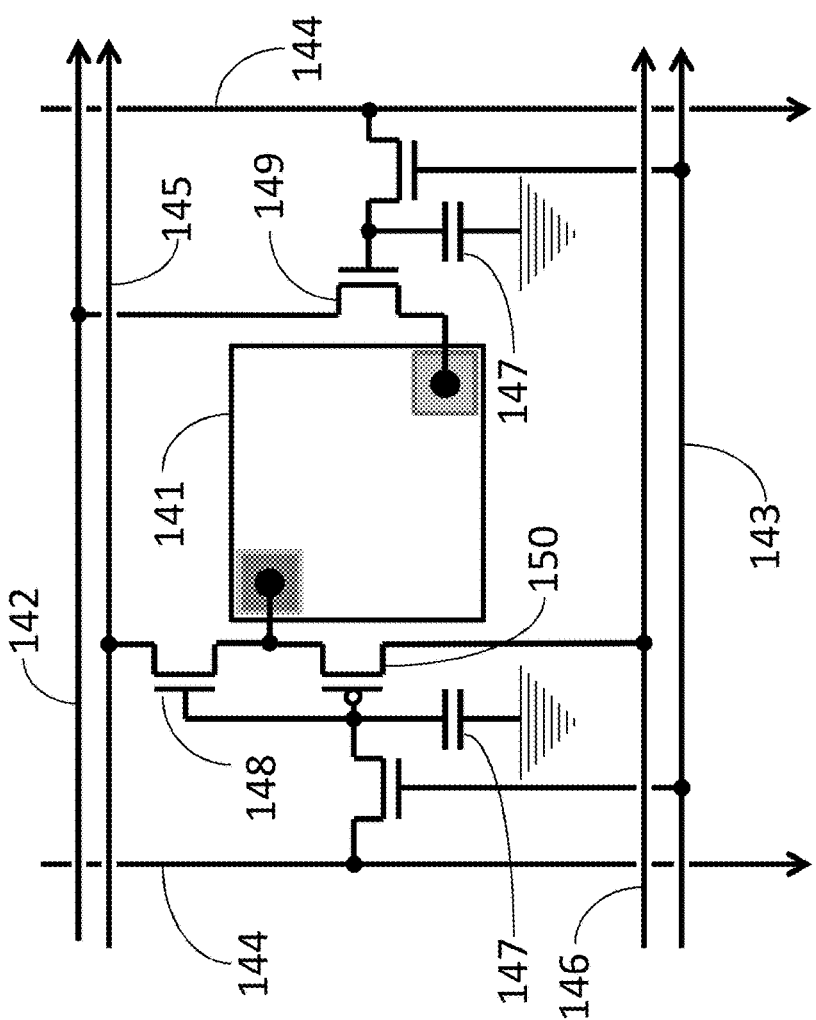
FIGS. 14A and 14B are diagrams of the connections to a section of an antenna array display, according to aspects of the disclosure.

Reference is again made to FIG. 9, a top view of a section of an antenna array, according to an aspect of the disclosure. Each section may have a power pad 91, which may be disconnected 97 from the other power pads, and a ground pad 91, which also may be disconnected 96 from other ground pads. Each such section may form a pixel or sub-pixel of an antenna array display. Reference is now made to FIG. 14A, an example diagram of the electrical connections to a section 141 of an antenna array display. Each section 141 of the antenna array may be individually placed into one of three modes: collecting light, generating light, or off. A section 141 may appear dark or black when it is collecting light because the light may be absorbed to generate electricity. A section 141 may appear bright when it is generating light, and a section may appear light or transparent when it is off. A positive clock pulse on the clock line 143 may store voltage levels from the data lines 144 into their respective capacitors 147. The capacitors may turn on N-channel transistors 148 and 149, which may connect the section to power 145 and ground 142 lines to collect light. Or the capacitors may turn on a P-channel transistor 150 and the N-channel transistor 149, which may be connected to the ground 142 and another power line 143, on which positive pulses of voltage may be applied for generating light. Otherwise the N-channel transistor 149 may be turned off, which may disconnect the section from either generating or collecting light.

Figure 14B:
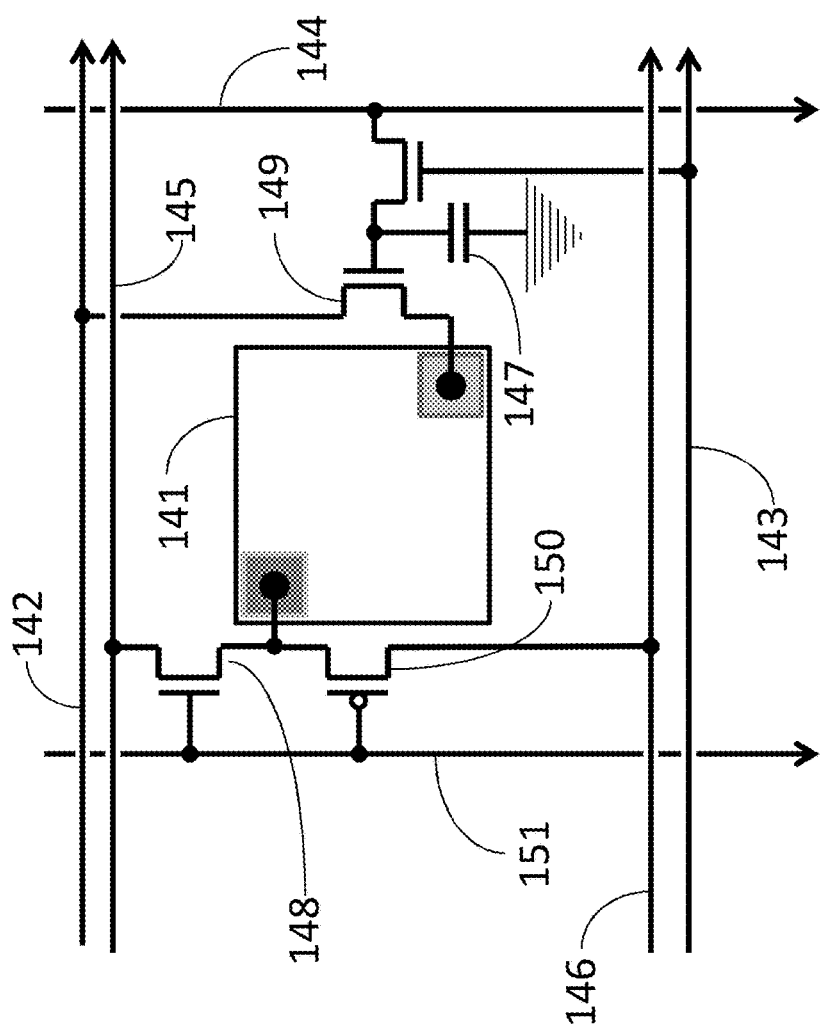

In another example, the antenna array may either generate light in a dark environment, or absorb light in a bright environment. Reference is now made to FIG. 14B, another example diagram of the connections of a section of an antenna array display. In this case, a mode line 151 may set all the sections of the antenna array display to either generate or absorb light when turned on by charging the capacitor 147, as discussed above.

Reference is now made to FIGS. 15A and 15B, example configurations of antenna array displays with reversible covers. A frame 153 may hold the antenna array display. In one configuration shown in FIG. 15A, the ambient light may be high enough so that the mode signal may be set to collect light. In this case the antenna array display's plastic base 152 may be below the cover glass 158, and the sections or pixels of the antenna array display may be either dark when collecting light or transparent when off, and the cover 154 may be folded by flexible hinges 155, or some other appropriate attachment device (e.g., a hinge that permits rotation of cover 154), such that a white or semi-reflective material 157 may be facing the display to reflect white light back through the transparent pixels. In another configuration shown in FIG. 15B, the ambient light may be low enough so that the mode signal may be set to generate light. In this case the cover glass 158 may be below the plastic base 152, and sections or pixels of the antenna array may be either light when generating light or transparent when off, and the cover may be folded in the opposite direction by flexible hinges 155, or other appropriate attachment device, as noted above, such that a dark or black material may be facing the display to ensure the background is black. It is further contemplated that the frame may also hold the control logic for controlling the pixels, which may be reversed based on the mode signal, and a battery which may be charged in the light collecting mode and discharged in the light generating mode.

In another embodiment of the present invention, a color display may be comprised of pixels each containing at least four sections of the antenna array display, where the plastic below each section may be colored with one of at least four different colored pigments. Reference is now made to FIG. 16, a diagram of a pixel comprised of four colored sections of an antenna array color display, respectively, red 164, green 161, blue 162 and yellow 163. As shown in FIGS. 14A and 14B, each of the four colored sections in each of the pixels in the antenna array color display may be independently controlled to be off or on, and as will the displays shown in FIGS. 15A and 15B, may either generate or absorb light. When generating light, the light may be colored by shining through a pigment in the plastic because the antennas generating the light may be below the plastic. When collecting the light, the full spectrum of light may be collected by the dark pixels because the antennas may be above the pigmented plastic, and when the pixels are off, the transparent sections may reflect the colored light off the reflective material beneath the plastic.

In yet another aspect of the present disclosure, different lengths of carbon nanotubes may be grown on different sections, such that when generating light, only a specific color is displayed, and when absorbing light only a specific color is absorbed.

Figure 17:
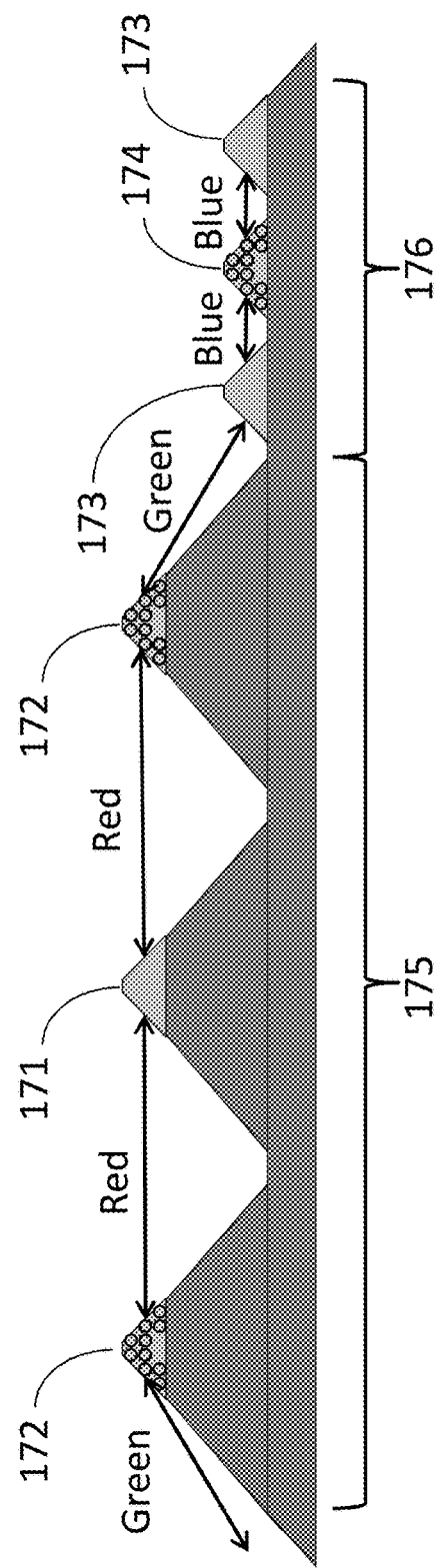
FIG. 17 is a cross-section of an antenna array with different sized ridges, according to an aspect of the disclosure.

Reference is now made to FIG. 17, a cross-section of an antenna array with different-sized ridges. It is contemplated that different lengths of carbon nanotubes may be grown successively across two different-sized ridges 175,176, such that three voltage levels may be applied to at least two power ridges (P1 171, and P2 173) and to at least two ground ridges (G1 172, and G2 174), such that all combinations of at least three colors, e.g., red, green and blue, may be generated using the following table:

TABLE 1

| | Voltage to Color Generated | | | | | | | |
|---|---|---|---|---|---|---|---|---|
| | | | | Color | | | | |
| P & G | All | R | G | B | RG | GB | RB | (none) |
| P1 171 | +V | +V | +V | +V | +V | 0 V | +V | 0 V |
| P2 173 | +V | 0 V | 0 V | +V | 0 V | 0 V | 0 V | 0 V |
| G1 172 | 0 V | 0 V | 0 V | +V | +V | +V | 0 V | 0 V |
| G2 174 | 0 V | 0 V | +V | 0 V | +V | 0 V | −V | 0 V |

It is further contemplated that an entire section may be composed of a repeating pattern of such ridges 175, 176, and a pixel may be comprised of multiple independently-controlled sections.

It will be appreciated by persons skilled in the art that the present invention is not limited by what has been particularly shown and described hereinabove. Rather the scope of the present invention includes both combinations and subcombinations of various features described hereinabove as well as modifications and variations which would occur to persons skilled in the art upon reading the foregoing description and which are not in the prior art.

We claim:

1. A solar antenna array configured to convert sunlight into electrical power, comprising:
   a plurality of parallel, electrically separated conducting ridges, disposed on a substrate, spanning in a first direction, and uniformly spaced in a second direction perpendicular to the first direction, wherein sides of the conducting ridges are sloped with respect to respective planes in a third direction that is perpendicular to a plane formed by the first and second directions;
   multiple carbon nanotube antennas, spanning varying distances along respective planes formed by the second and third directions, and having two ends, one of which is coupled to one of the ridges, and the other of which is coupled to a different one of the ridges; and
   at least one diode connected between at least one of the two ends of a respective carbon nanotube antenna and a respective one of the ridges to which the at least one of the two ends is coupled.

2. The solar antenna array as in claim 1, wherein a respective one of the carbon nanotube antennas is coupled to two respective adjacent ones of the parallel, electrically separated conducting ridges locations on adjacent sloped sides of the two respective adjacent ones of the parallel, electrically separated conducting ridges.

3. The solar antenna array as in claim 2, wherein the at least one diode comprises a first diode and a second diode, wherein the first diode is connected between one end of a respective carbon nanotube antenna and one of the two respective adjacent parallel, electrically separated conducting ridges, and wherein the second diode is connected between the other end of the same respective carbon nanotube antenna and the other of the two respective adjacent parallel, electrically separated conducting ridges.

4. The solar antenna array as in claim 3, wherein the first diode comprises a metal oxide carbon (MOC) tunnel diode and the second diode comprises a metal insulator insulator metal (MIIM) tunnel diode.

5. The solar antenna array as in claim 2, wherein one end of the respective carbon nanotube antenna is conductively connected to a first one of the two respective adjacent ones of the parallel, electrically separated conducting ridges.

6. The solar antenna array as in claim 5, wherein a respective one of the at least one diode is connected between one end of the respective carbon nanotube antenna and a second one of the two respective adjacent ones of the parallel, electrically separated conducting ridges.

7. The solar antenna array as in claim 6, wherein the respective one of the at least one diode is a metal insulator insulator metal (MIIM) diode.

8. The solar antenna array as in claim 6, wherein the respective one of the at least one diode is a metal oxide carbon (MOC) tunnel diode.

9. The solar antenna array as in claim 1, further comprising:
   an insulating base, wherein the substrate forms a top part of the insulating base;
   a plurality of pads, each of the plurality of pads connected to a respective set of the plurality of parallel, electrically separated conducting ridges, on top of the substrate, wherein the substrate comprises an insulating material;
   a plurality of electrically conducting lines within the insulating base, wherein the plurality of electrically conducting lines is comprised of metal film; and
   a plurality of conducting vias configured to connect a respective line of the plurality of electrically conducting lines to a respective set of the plurality of pads;
   wherein a respective pad of the plurality of pads connects to one of the plurality of electrically conducting lines through a respective one of the plurality of conducting vias.

* * * * *